United States Patent
Marin et al.

(10) Patent No.: US 12,336,197 B2
(45) Date of Patent: Jun. 17, 2025

(54) IN-PLANE INDUCTORS IN IC PACKAGES

(71) Applicant: Intel Corporation, Santa Clara, CA (US)

(72) Inventors: Brandon C. Marin, Chandler, AZ (US); Tarek Ibrahim, Mesa, AZ (US); Prithwish Chatterjee, Tempe, AZ (US); Haifa Hariri, Phoenix, AZ (US); Yikang Deng, Saratoga, CA (US); Sheng C. Li, Gilbert, AZ (US); Srinivas Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1136 days.

(21) Appl. No.: 16/804,317

(22) Filed: Feb. 28, 2020

(65) Prior Publication Data

US 2021/0273036 A1    Sep. 2, 2021

(51) Int. Cl.
*H10D 1/20*      (2025.01)
*H01L 21/48*     (2006.01)
(Continued)

(52) U.S. Cl.
CPC .......... *H10D 1/20* (2025.01); *H01L 21/4857* (2013.01); *H01L 23/49822* (2013.01);
(Continued)

(58) Field of Classification Search
CPC ............. H01L 28/10; H01L 21/4857; H01L 23/49822; H01L 23/49838; H01L 24/16;
(Continued)

(56) References Cited

U.S. PATENT DOCUMENTS 6,396,122 B1 * 5/2002 Howard ............... H01L 27/08
                                                   257/E21.022
2009/0072388 A1 * 3/2009 Tews .................. H01L 23/5389
                                                   257/E23.003
(Continued)

FOREIGN PATENT DOCUMENTS

JP       H10303563 A      11/1998
JP       2006060029 A      3/2006
(Continued)

OTHER PUBLICATIONS

J.L. Shohet, Plasma Science and Engineering, 2003, Encyclopedia of Physical Science and Technology (Third Edition), Academic Press, pp. 401-423, ISBN 9780122274107, https://doi.org/10.1016/B0-12-227410-5/00584-6. https://www.sciencedirect.com/science/article/pii/B0122274105005846 (Year: 2003).*

(Continued)

*Primary Examiner* — Fernando L Toledo
*Assistant Examiner* — Jahae Kim
(74) *Attorney, Agent, or Firm* — Essential Patents Group, LLP

(57) ABSTRACT

An integrated circuit (IC) package substrate, comprising a magnetic material embedded within a dielectric material. A first surface of the dielectric material is below the magnetic material, and a second surface of the dielectric material, opposite the first surface, is over the magnetic material. A metallization level comprising a first metal feature is embedded within the magnetic material. A second metal feature is at an interface of the magnetic material and the dielectric material. The second metal feature has a first sidewall in contact with the dielectric material and a second sidewall in contact with the magnetic material.

19 Claims, 24 Drawing Sheets

(51) Int. Cl.
*H01L 23/00* (2006.01)
*H01L 23/498* (2006.01)
*H05K 1/18* (2006.01)

(52) U.S. Cl.
CPC ........ *H01L 23/49838* (2013.01); *H01L 24/16* (2013.01); *H05K 1/181* (2013.01); *H01L 2224/16227* (2013.01); *H01L 2924/19042* (2013.01); *H01L 2924/19103* (2013.01); *H05K 2201/10378* (2013.01)

(58) Field of Classification Search
CPC . H01L 2224/16227; H01L 2924/19042; H01L 2924/19103; H01L 2224/16225; H01L 2224/32225; H01L 2224/73204; H01L 2924/15311; H01L 23/5227; H01L 23/645; H01L 23/50; H01L 23/528; H01L 23/53209; H01L 23/64–66; H01L 2223/64–6694; H05K 1/181; H05K 2201/10378; H03H 2001/0071; H01F 2017/0086

See application file for complete search history.

(56) References Cited

U.S. PATENT DOCUMENTS

| | | | |
|---|---|---|---|
| 2012/0021204 A1* | 1/2012 | Pei | B81C 1/00087 216/2 |
| 2012/0038025 A1* | 2/2012 | Teggatz | H01L 23/645 257/E21.502 |
| 2016/0233153 A1* | 8/2016 | Kidwell, Jr. | H01L 21/4857 |
| 2018/0033753 A1* | 2/2018 | Camarota | H01L 23/49827 |
| 2018/0102207 A1* | 4/2018 | O'Sullivan | H01F 7/06 |
| 2019/0304661 A1* | 10/2019 | Xu | H01F 17/0006 |
| 2020/0144235 A1* | 5/2020 | Kang | H01L 23/49822 |
| 2020/0411317 A1* | 12/2020 | Ecton | H01L 21/4846 |

FOREIGN PATENT DOCUMENTS

| | | |
|---|---|---|
| JP | 2008294084 A | 12/2008 |
| JP | 2013236046 A | 11/2013 |
| JP | 2019075478 A | 5/2019 |

OTHER PUBLICATIONS

Office Action from Japanese Patent Application No. 2020-203324 notified Dec. 11, 2024, 11 pgs.

* cited by examiner

IN-PLANE INDUCTORS IN IC PACKAGES

BACKGROUND

Integration of inductive structures within integrated circuit (IC) package substrate material is important for increasing power delivery in high performance IC devices. Inductive structures with magnetic material can be placed in any layer in the package, thus enabling multiple type's architectures. For example, in-plane inductors formed by patterning conductive layers within a package substrate may be embedded within magnetic core material integrated within cavities formed in a package substrate.

However, integration of magnetic materials within a package substrate carries process and architectural challenges. One area that the integration of embedded inductive structures presents a challenge is for coreless packages, where traces with improved power delivery are fully enclosed by magnetic material. Fully encapsulating a trace with magnetic material may require multiple de-paneling operations, for example to access a backside of the package buildup where supplemental magnetic material is applied over a trace that was only partially embedded during frontside buildup. In some situations, this supplemental magnetic material may need to be of a different magnetic composition, introducing other complications associated with a multiplicity of magnetic materials.

Methods and architectures that allow full encapsulation without de-paneling and/or a single magnetic material would reduce process risk and add process flexibility.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

Figures referred to as "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

DETAILED DESCRIPTION

Figure 1:
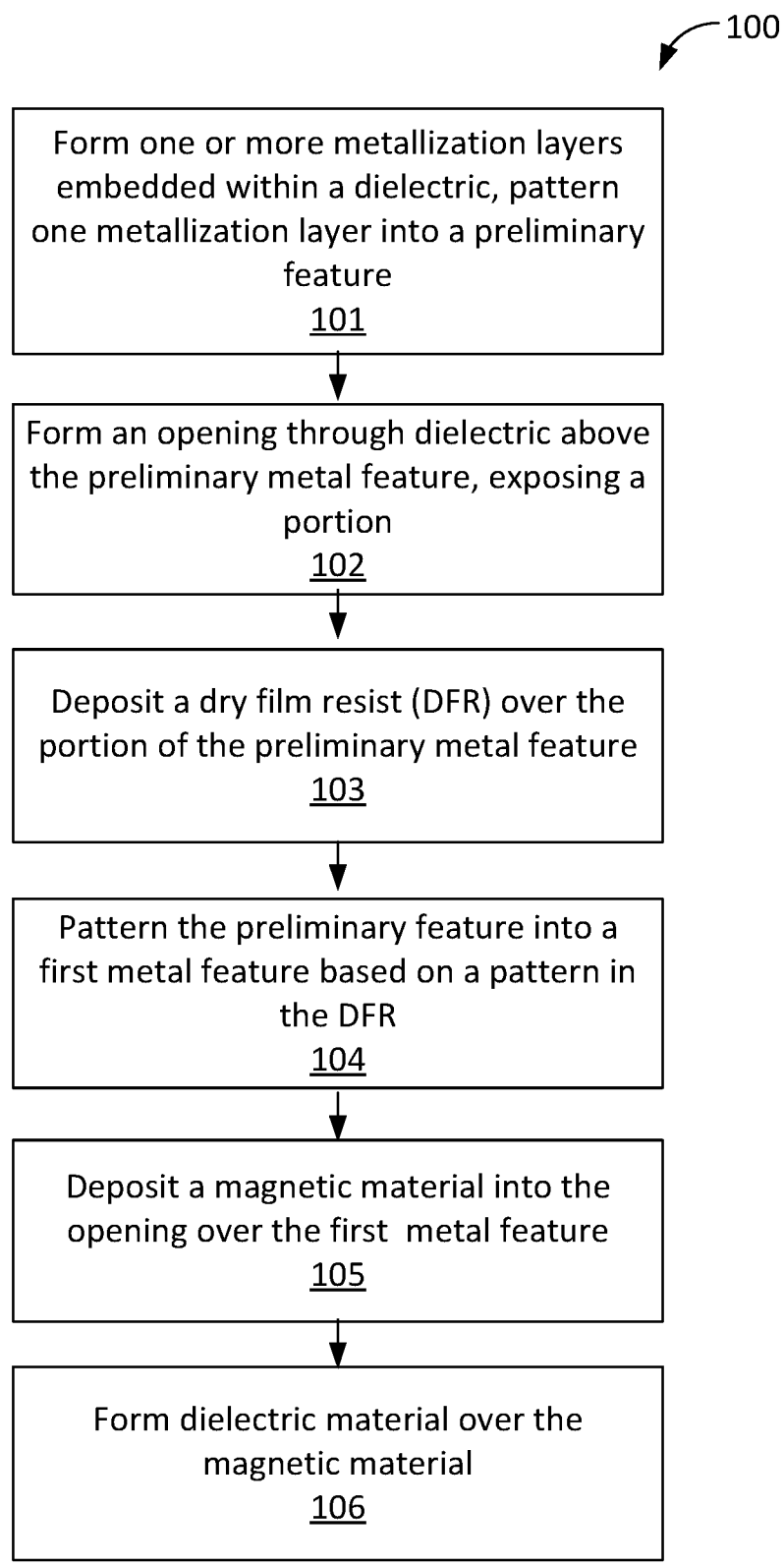
FIG. 1 illustrates a process flow chart of exemplary methods for making a package-integrated in-plane inductor (illustrated in FIGS. 2A-2M), according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

The term "microprocessor" generally refers to an integrated circuit (IC) package comprising a central processing unit (CPU), a graphical processing unit (GPU, field-programmable gate array (FPGA) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the 2-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close." "approximately," "near," and "about," generally refer to being within +/−10% of a target value (unless specifically specified). Unless otherwise specified the use of the ordinal adjectives "first," "second," and "third." etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Embodiments of package-integrated inductive structures and methods of making the package-integrated inductive structures are described herein. As described herein, lithographic steps and magnetic material sets may be minimized. Additionally, according to embodiments described herein, one may fully encapsulate inductor metallization in a single magnetic material without depaneling the in-process package substrate.

FIG. 1 illustrates a process flow chart of exemplary methods 100 for making a package-integrated in-plane inductor, according to some embodiments of the disclosure. Methods 100 may be performed as part of any panelized IC package substrate fabrication process compatible with coreless package substrate architectures. Such a process may also be performed as part of an IC package substrate fabrication process compatible with cored substrate technology.

Operation 101 comprises forming one or more metallization layers in a build-up material. Metallization layers may be formed between dielectric layers in a package substrate build-up stack. The stack may be formed, for example, by laminating sheets of the dielectric material in a hot roller or vacuum lamination process. The newly laminated sheet bonds to the underlying dielectric, forming a monolithic dielectric substrate. In some operations, the laminated sheet comprises a film (e.g., 2 microns) of copper to provide a plating seed surface. After a dielectric lamination cycle, a metal such as copper may be plated over an exposed surface of the dielectric to form a metallization layer. The plated metallization layer may be un-structured or "blanket" deposited, then subsequently etched through a lithographically defined photomask to form a preliminary metal feature. Alternatively, a metallization layer may be selectively plated through a lithographically defined photomask to form the preliminary metal feature. One or more additional layers of dielectric may be formed to embed the preliminary metal features.

At operation 102 one or more apertures are formed through the dielectric with a subtractive process to expose a portion of the preliminary metal feature. In some embodiments, these apertures are formed by a laser drilling operation, where preliminary metal feature prevents the laser from penetrating into lower levels of the package substrate. Apertures may be formed by other methods, such as with a dry and/or wet etch of the dielectric according to a lithographically-defined etch mask. For etch methods, the preliminary metal feature may be employed as an etch stop.

At operation 103, a layer of photoresist is deposited over the sidewalls and bottom of the aperture(s), covering the exposed portion of the preliminary metal feature. Dielectric surrounding the aperture(s) may also be covered by the photoresist. In some embodiments, a dry film resist (DFR) is laminated to conformally cover the preliminary metal feature and aperture sidewalls, for example with a vacuum hot roller/press or vacuum lamination process.

At operation 104, the portion of DFR over at least the exposed portion of the preliminary metal feature is patterned to define at least a portion of an inductor routing structure.

The pattern features may comprise a straight or serpentine planar inductor trace, or a vertical interconnect route to a planar inductor trace, for example. The etch mask is then removed, leaving the inductor routing structure at the bottom of an aperture within the package material stack.

At operation 105 a magnetic material is applied over the inductor routing structure to at least partially fill the aperture. A moldable paste or viscous matrix comprising magnetic particles may be printed by ink jet or screen printed into the aperture(s), for example. The magnetic material may be chosen to have a suitable magnetic permeability. The aperture(s) may be completely filled, covering the inductor trace feature and aperture sidewalls. Deposition may be followed by a cure to harden the matrix into a solid magnetic material partially encapsulating the inductor structure. The resulting inductive device may have a particular inductance determined by the structure of the inductor trace and the size and permeability of the core comprising the magnetic material.

Employing the above techniques, one may fully encapsulate an inductor structure by first forming a magnetic material below the preliminary metal feature. As described further below, an underlying magnetic material may be formed, for example through a preliminary iteration of operations 101, 102, and 105 whereby an inductive device may comprise an inductor routing structure embedded between two magnetic material-filled apertures stacked one above the other. In other examples, underlying magnetic material may be formed as part of a composite foil that may be applied as part of operation 101 whereby an inductive device may comprise an inductor routing structure and only one magnetic material-filled aperture.

At operation 106, the magnetic material is capped by one or more layers of dielectric, completely embedding the inductive structure within the package substrate dielectric. Any number of additional build-up dielectric and/or metallization material layers may be formed according to any known techniques to arrive at a final package substrate structure suitable for a given IC chip and/or application.

FIGS. 2A-2M illustrate cross-sectional and plan views of representative structures formed at different stages of an exemplary process for forming package substrate 200 comprising an embedded inductor, according to some embodiments of methods 100.

Figure 2A:
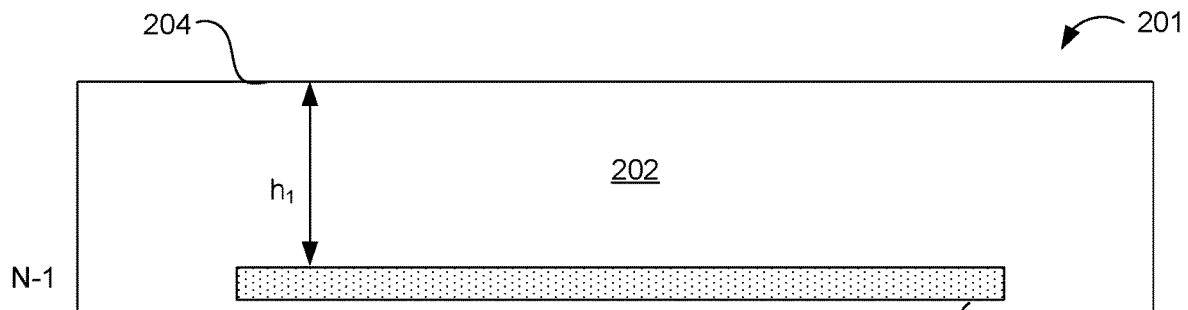
FIGS. 2A-2M illustrate cross-sectional and plan views of representative structures formed at different stages of an exemplary process flow for forming a package substrate comprising an embedded inductor, according to some embodiments of the disclosure.

In FIG. 2A, an in-process IC package substrate stack 201 is received. Package substrate stack 201 comprises a dielectric 202. In some embodiments, dielectric 202 comprises a material such as, but not limited to, epoxy-phenolic resins or epoxy cyanate ester resins as dielectric build-up films laminated on a package core or on a carrier panel for coreless package substrate embodiments. The epoxy resin laminates may have thicknesses ranging between 10 and 100 microns, for example. Package substrate stack 201 may be formed by build-up of multiple layers of epoxy resin-based dielectric film layers laminated in succession on a growing stack. The package substrate stack architecture may accommodate flip-chip package architectures or bumpless build-up level (BBUL) package architectures, for example.

Layers of metallization between dielectric layers may comprise copper, other suitable metals, or other conductive materials electroplated or otherwise formed directly on dielectric material after any given iteration of a lamination process. Conductive layers may be numbered as metallization levels within the package substrate stack 201. Highest level metallization may be the Nth or N+m level at or nearest to a first (e.g., top) side of the package substrate, formed over multiple metallization layers N−1, N−2, etc., embedded successively deeper within a package dielectric material within package substrate stack 201. Bottom-level metallization (e.g., comprising die interconnects) is generally the level of metallization nearest to a second (e.g., bottom) side of package substrate stack 201. As an example, a copper layer may be sputtered, plated, or a copper foil may be laminated as a metallization layer N−1 of the in-process package substrate stack 201. The copper layer may have a thickness of 5-50 microns, for example, and may be patterned to include metal features such as interconnects for attaching package substrate stack 201 to an IC die or to a host component (not shown). Metallization level N−1 is patterned to include metallization feature 203. For embodiments where metallization level N−1 is plated, metallization feature 203 may be formed by a semi-additive process (SAP). For example, a plating mask may have been employed to form metallization feature 203. For embodiments where metallization level N−1 is applied as a foil or plated without a mask, metallization feature 203 may be formed by a subtractive process. For example, a masked etch process (e.g., wet chemical) may have been employed to form metallization feature 203.

A layer of dielectric 202 may be applied over the metallization layer N−1 to embedded metallization feature 203 within dielectric 202 at a distance $h_1$ below a top surface 204. Metallization feature 203 may have any arbitrary shape in a plane of metallization level N−1. Metallization feature 203 may have a lateral dimension (in the x and y plane) of approximately 500 microns to 20 mm and a thickness (e.g., z-axis) ranging between 15 and 200 microns, for example. Although not shown, coplanar metallization features within conductive level N−1 may be adjacent to metallization feature 203.

Figure 2B:
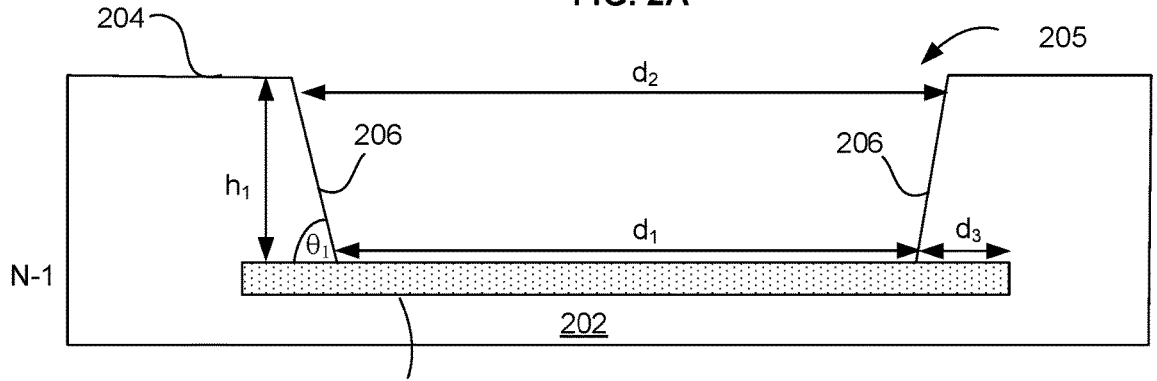

In FIG. 2B, an aperture 205 is formed in the overlying dielectric 202. In some embodiments, aperture 205 is formed by laser drilling openings to a depth $h_1$, exposing at least a portion of metallization feature 203. One or more apertures 205 may be formed by laser ablation of the dielectric material, for example due to the intense heat generated by the laser energy. A $CO_2$ or Nd:YAG laser may be employed as the laser source, for example. Metallization feature 203 may impede the laser beam (e.g., as a laser stop), preventing it from penetrating into underlying dielectric material of the package substrate stack 201. Laser ablation of dielectric 202 may result in sidewalls 206 being tapered as shown. The slope angle $\theta_1$ of sidewalls 206 may range between 45° and 85° with respect to the plane of metallization level N−1. As a result of the sloped sidewalls, aperture 205 may have a larger span at the opening (e.g., intersection of sidewalls 206 with surface 204). For example, distance $d_2$ may be larger than $d_1$ by $h_1 \tan(\pi/2 - \theta_1)$. The laser may cause some minor ablation of metal from a surface on the metallization feature 203 itself, resulting in scalloping or other damage artifacts indicative of the laser drilling process. For example, ablation of metallization feature 203 may excavate metal to depths ranging between 100 nm to 2-3 microns. Unablated remnants of the overlying dielectric may also be deposited on the surface of the laser stop in the form of small particles of inorganic filler material.

In some alternative embodiments, aperture 205 is formed by a wet or dry masked etch process. For some dry-etch processes, sidewalls 206 may be substantially straight. For such embodiments, metallization feature 203 may serve as an etch stop, as the rate of etching of metals like copper may be significantly slower than the etch rate of organic materials by the etchant. Metallization structure 203 may thus protect the dielectric material below from the etch process.

Aperture 205 may be formed to a depth $h_1$ (e.g., z-height) of between 15 and 200 microns, for example. Aperture 205 may have a length $d_1$ measured at the bottom of aperture 205 ranging between 500 microns to 15 mm, for example. Metallization feature 203 may extend laterally a distance $d_3$ from the bottom of sidewalls 206, separated, for example, by distance de at the bottom of aperture 205. In the illustrated example, metallization feature 203 may have a length (e.g., in the x dimension) of $d_1 + 2d_3$ with $d_3$ being sufficient to ensure a safe overlay margin between aperture 205 and metallization feature 203 The perimeter of aperture 205 may have any arbitrary shape within the confines of metallization feature 203. As aperture 205 may have lateral dimensions many times larger than a beam width of a laser drill, the laser beam may be rastered over any area to excavate an opening between the length and width limits defined by edges of metallization feature 203.

Figure 2C:
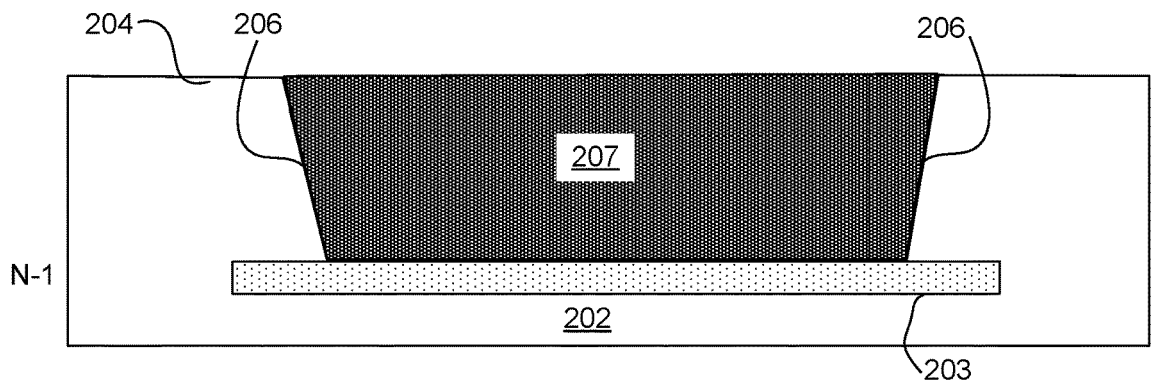

In FIG. 2C, magnetic material 207 is deposited into aperture 205, covering metallization feature 203 and sidewalls 206. Suitable magnetic materials may comprise non-conductive magnetic filler particles such as ferrite or iron oxide powders suspended in any matrix material. In some embodiments, an organic matrix may contain cross-linkers and polymer precursors that are activated by heat and/or light to cure the matrix into a solid mass once deposited within aperture 205, and contact with sidewalls 206 and metallization feature 203. Magnetic material 207 may be deposited as a moldable paste or ink into aperture 205 and then cured by heat and/or light treatments, for example. Deposition processes may include screen printing or ink jet printing of the material into aperture 205. During deposition, the magnetic material 207 may fill the cavities and overflow laterally and vertically (in the z-direction), extending above surface 204. A polish or grind operation may follow to planarize magnetic material 207 with surface 204 substantially as illustrated in FIG. 2C.

Figure 2D:
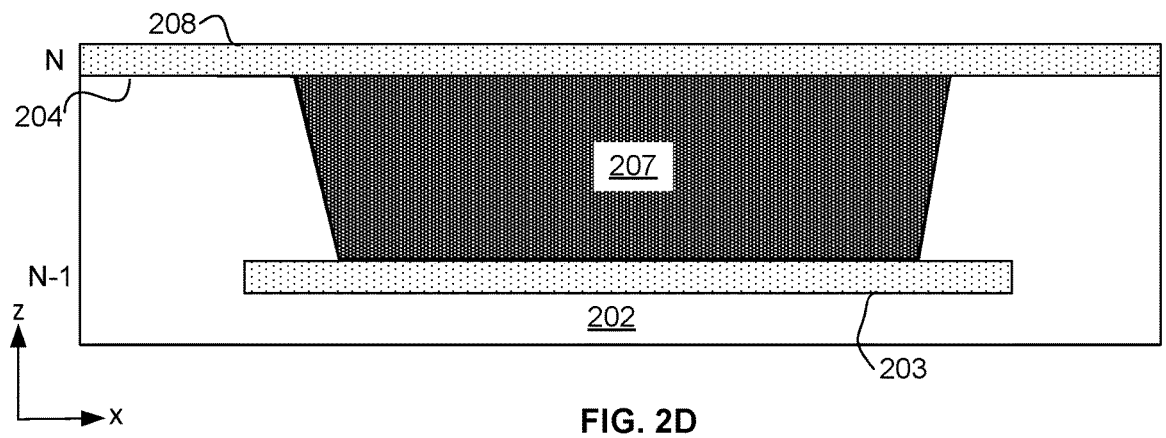

In FIG. 2D, another metallization level N is formed over dielectric 202 and magnetic material 207. Metallization level N may comprise a copper foil, having a thickness between surfaces 204 and 208 ranging between 5 and 50 microns. In alternative embodiments, metallization level N is formed by electroplating or sputtering copper or another suitable metal over surface 204 and the planarized surface of magnetic material 207. If electrolytically plated, a thin film conductive seed layer comprising copper, gold, silver or other suitable metal may be deposited in a preliminary operation as a cathode. A seed layer may also be deposited to promote nucleation of metal precursors in a CVD atmosphere. An adhesion layer comprising chromium may be deposited ahead of the seed layer.

Figure 2E:
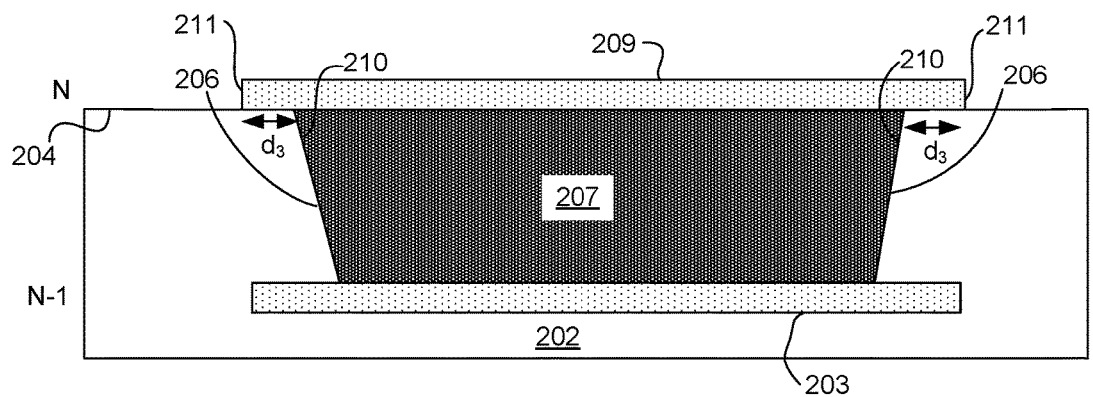

In FIG. 2E, a preliminary metallization feature 209 is formed at metallization level N over magnetic material 207 and extending laterally by a distance da from the upper boundaries of magnetic material 207 defined by the intersection of magnetic material edges 210 and surface 204. Preliminary metallization feature 209 may be one of a plurality of features formed in metallization layer N, coplanar with adjacent features such as interconnect traces, pads and other structures not shown in the illustrated example. In this example, preliminary metallization feature 209 has been subtractively patterned, for example with an etch process according to an etch mask. In alternative embodiments, preliminary metallization feature 209 may be selectively formed according to an SAP, for example where preliminary metallization feature 209 is plated up through a patterned plating mask (not shown).

Preliminary metallization feature 209 may have any suitable shape that extends laterally (e.g., by distance $d_3$) beyond the upper boundaries of magnetic material 207 at surface 204 such that preliminary metallization feature 209 will be suitable as a laser or etch stop in subsequent formation of an aperture above metallization level N. Preliminary metallization feature 209 may have lateral dimensions of 500 microns to 20 mm or greater than $d_2$, for example. Preliminary metallization feature 209 may have a thickness (e.g., z-height) between 2 to 15 microns, for example. Depending on whether a subtractive or additive process is practiced, sidewalls 211 may be substantially vertical, and/or have a rounded upper edge), or may be display curvature indicative of an isotropic etch process.

Figure 2F:
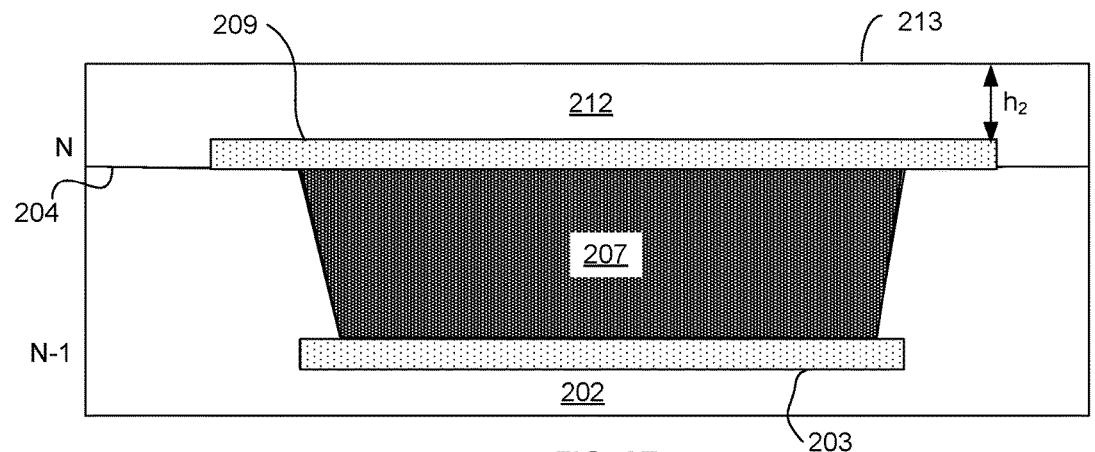

In FIG. 2F, dielectric 212 is formed over preliminary metallization features 209 and over dielectric surface 204. In some embodiments, dielectric 212 is laminated as a dielectric sheet over package substrate stack 201, for example in a hot roller or vacuum lamination process. Dielectric 212 may be substantially the same as dielectric 202. In some embodiments, dielectric 212 has a thickness $h_2$ between preliminary metallization feature 209 to surface 213 of 10-50 microns.

Figure 2G:
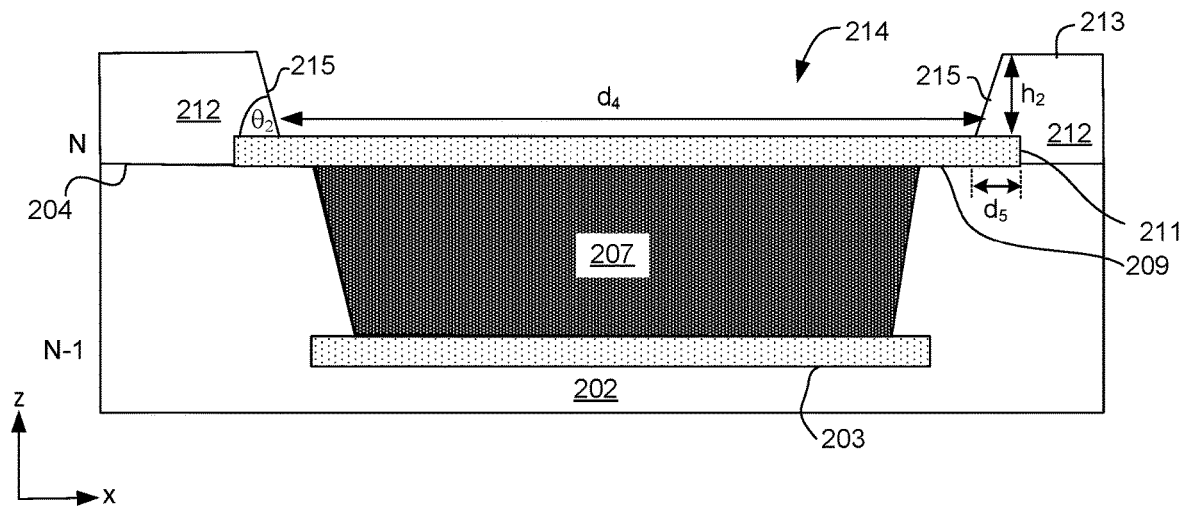

In FIG. 2G, an aperture 214 is formed through dielectric 212 to depth $h_2$. In some embodiments, aperture 214 is formed by a laser drill process (e.g., similar to that employed to form aperture 205) or by any suitable etch process. Aperture 214 exposes a length $d_4$ of preliminary metallization feature 209. Sidewalls 215 may again be sloped at an angle $\theta_2$ (e.g., ranging between 45° to) 85° with respect to the plane of preliminary metallization feature 209, for example as a result of a laser drilling process. Portions of preliminary metallization feature 209 unexposed by the formation of aperture 214 extend laterally outward from each aperture sidewall 215 by a distance $d_5$ through dielectric 212, where $d_5$ may be approximately $h_2 \tan(\pi/2-\theta_2)$.

Figure 2H:
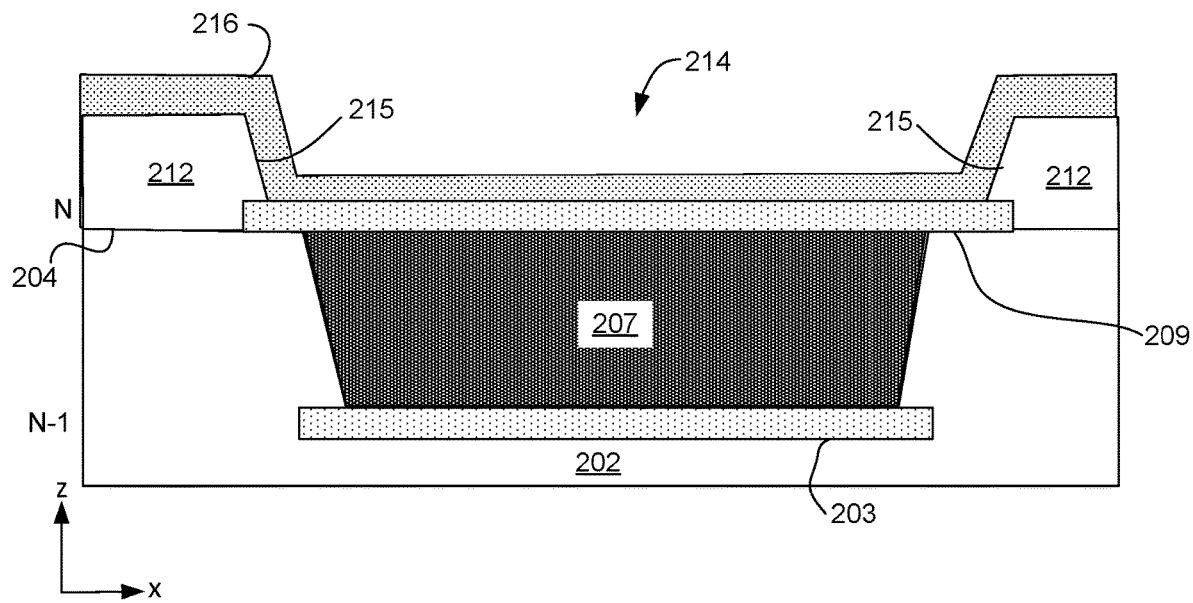

In FIG. 2H, photoresist 216 is applied over dielectric 212 and aperture 214, conformally covering preliminary metallization feature 209 at the bottom of aperture 214 and sidewalls 215. Photoresist 216 may be a dry film resist (DFR) having a thickness ranging between 10 microns and 100 microns, for example. A DFR may be applied by vacuum lamination or hot lamination to soften and/or mold the DFR to conform to aperture 214.

Figure 2I:
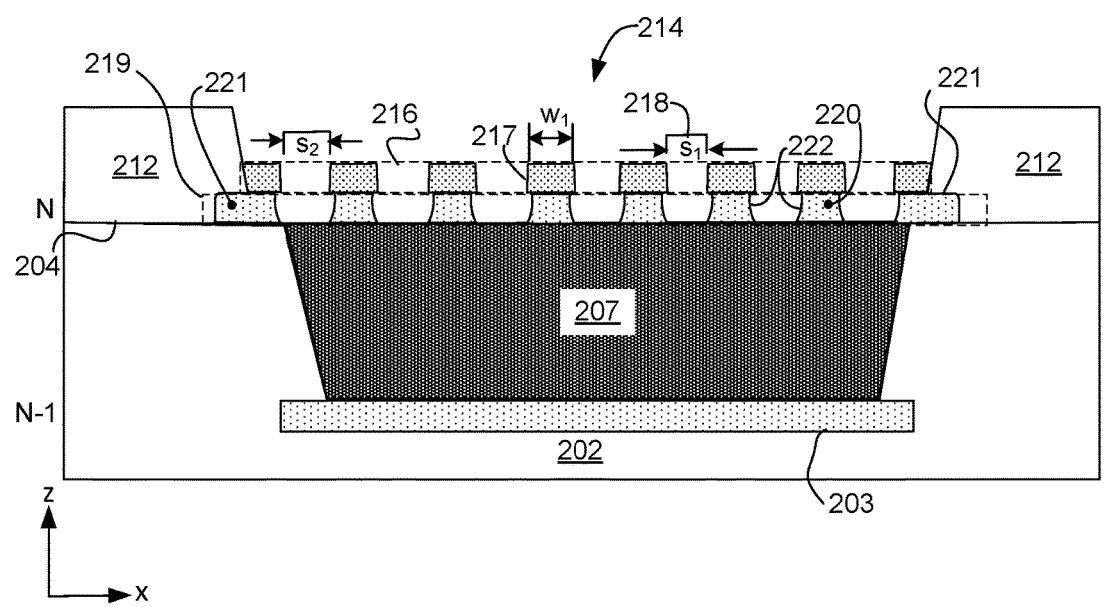

In FIG. 2I, photoresist 216 (delineated by upper dashed outline) has been patterned by a photolithographic process to include stripes 217 and openings 218, both extending lengthwise in the y-dimension. In some examples, stripes 217 and openings 218 of preliminary metallization feature 209 may be etched according to the pattern in photoresist 216 to form an in-plane inductor routing structure 219 (delineated by lower dashed outline) comprising traces 220) (shown in cross-section). In the illustrated embodiment, traces 220) each have a linewidth $w_1$ of 5-50 microns and some minimum spacing $s_1$ of 10-100 microns between traces 220. Because aperture 214 underlaps edges of preliminary metallization feature 209, a perimeter "ring" structure 221 comprising a masked portion of preliminary metallization feature 209 is adjacent to inductor traces 220 (further visible in plan view of FIG. 2M). Ring structure 221 may be electrically isolated from inductor traces 220 and is indicative of the practice of methods 100. While the illustrated embodiment shows traces 220) exhibiting substantially uniform linewidth and spacing, in other embodiments some traces 220) may have different spacing and linewidth. For example, spacing $s_2$ between ring structure 221 and a terminal trace 220 may be different from inter-trace minimum spacing $s_1$.

Figure 2J:
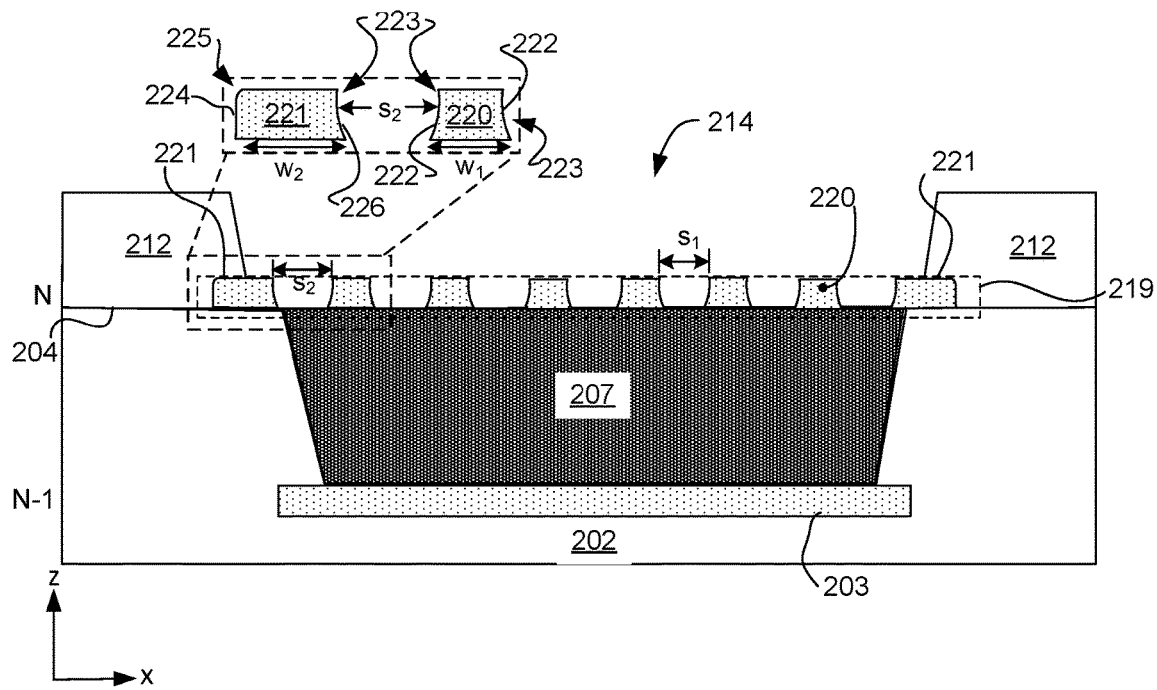

As shown in FIG. 2J, photoresist 216 has been stripped, exposing etched inductor traces 220 and the exposed portion of ring structure 221 extending within aperture 214. Inductor traces 220 and ring structure 221 may have a thickness ranging from 5-50 microns. Sidewalls 222 of inductor traces 220 have a sloped and/or curved profile 223 indicative of a wet (e.g., isotropic) chemical etch patterning process. The sloped sidewalls 222 give inductor traces 220 a substantially trapezoidal cross-sectional profile, for example as further shown in the inset. The trapezoidal profile of inductor traces 220 may result from a subtractive isotropic wet etch process, where lateral chemical etching occurs simultaneously with vertical chemical etching within the exposed metal regions. As a result, sidewalls 222 may have a curved negative taper, resulting in some minimum spacing $s_1$ between inductor traces 220).

In some embodiments, outer sidewall 224 of ring structure 221 has a substantially vertical and straight profile, for example indicative of a semi-additive patterning of preliminary metallization feature 209 where metallization features are electroplated into a patterned plating mask. Plating mask openings may have straight sidewalls that are substantially vertical or having a slope of less than 10° from the vertical. Sidewall 224 may also have a rounded upper edge 225, again indicative of a semi-additive patterning of preliminary metallization feature 209. As shown in the inset of FIG. 2J for ring structure 221, outer sidewall 224 was not subject to a subtractive etch while inner sidewall 226 of ring structure 221 was exposed within aperture 214, and therefore was subjected to the subtractive etch process employed to pattern the inductor traces 220. Hence, not only is the presence of ring structure 221 indicative of methods 100, but differences in the profiles of inner and outer sidewalls 224 and 226 are further indications of the fabrication techniques employed.

Figure 2K:
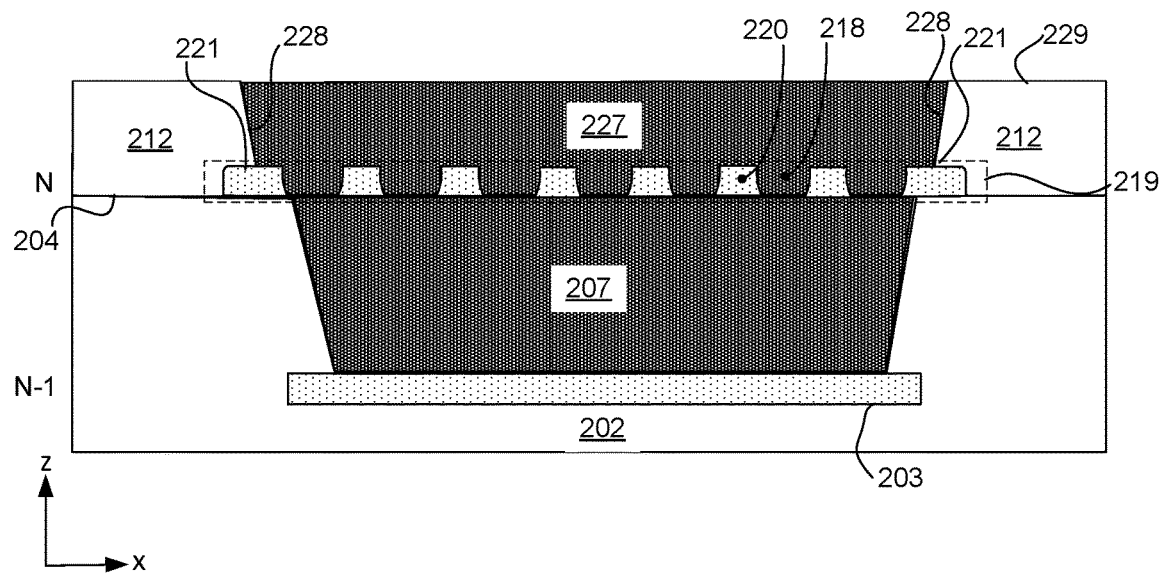

As shown in FIG. 2K, magnetic material 227 is deposited into aperture 214 (e.g., as shown in FIG. 2J), covering inductor traces 220) and the exposed adjacent portions of ring structure 221. Magnetic material may have similar lateral dimensions as aperture 214 (e.g., 500 microns to 15 mm), and a thickness (z-height) between 5 and 100 microns, for example. In the illustrated embodiment, ring structure 221 extends across the interface 228 at the boundary between magnetic material 227 and dielectric 212. Inner sidewall 226 is within magnetic material 227, whereas outer sidewall 224 is embedded within dielectric 212.

In some embodiments, magnetic material 227 is substantially the same material as magnetic material 207, as described above. In some other embodiments, magnetic material 227 is a different material than magnetic material 207. Magnetic material 227 may, for example, have a relative magnetic permeability of 5-10. Magnetic material 227 may be deposited by printing the material into aperture 214. In some embodiments, magnetic material 227 has a relatively low initial viscosity so that it may be printed by ink jet directly into aperture 214. In some embodiments, magnetic material 227 is a paste that is otherwise applied over surface 228 of dielectric 212, filling aperture 214. Magnetic material 227 may contact magnetic material 207 below through openings 218 between inductor traces 220, forming a contiguous mass encapsulating inductor traces 220. Excess material may be scraped off of surface 229, leaving magnetic material 227 within aperture 214 at surface 228.

A thermal or photochemical curing process may follow, hardening magnetic material 227. Inductor traces 220 completely embedded within magnetic material (e.g., magnetic material 207 below and magnetic material 227 above). The combined magnetic material may form a magnetic core encapsulating inductor traces 220. In-plane inductor structure 219 is fully embedded within the dielectric of package substrate 200. A magnetic core fully embedding inductor traces 220 is formed from combined magnetic materials 207 and 227 having a total thickness ranging between 10 and 200 microns, and a relative magnetic permeability between 5 and 10. Ring structure 221 extends across the interface between magnetic material 227 and adjacent dielectric 212 with outer sidewall 224 embedded within dielectric 212. Magnetic material 227 may be planarized with surface 229 by a grind and/or polish process (e.g., chemical-mechanical polishing, CMP).

Figure 2L:
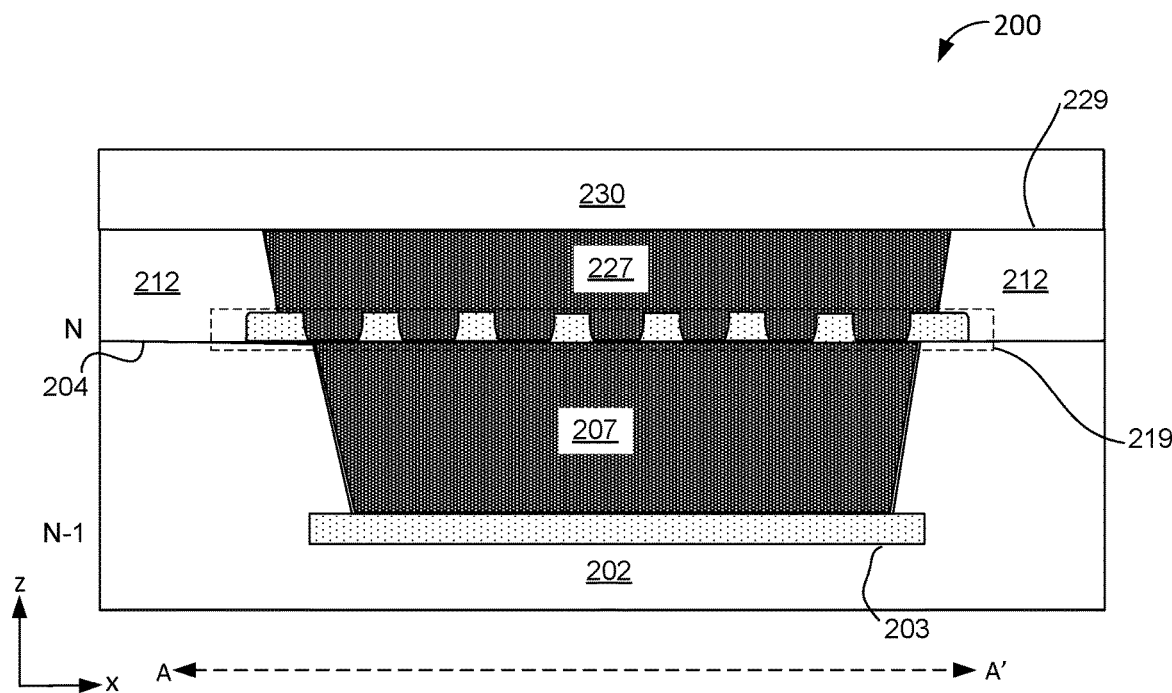

As shown in FIG. 2L, fabrication of in-plane inductor structure 219 is substantially complete. Magnetic material 227 is capped by dielectric material, for example by lamination of dielectric 230 over surface 229 to either complete package substrate 200 or in preparation for subsequent metallization levels.

Figure 2M:
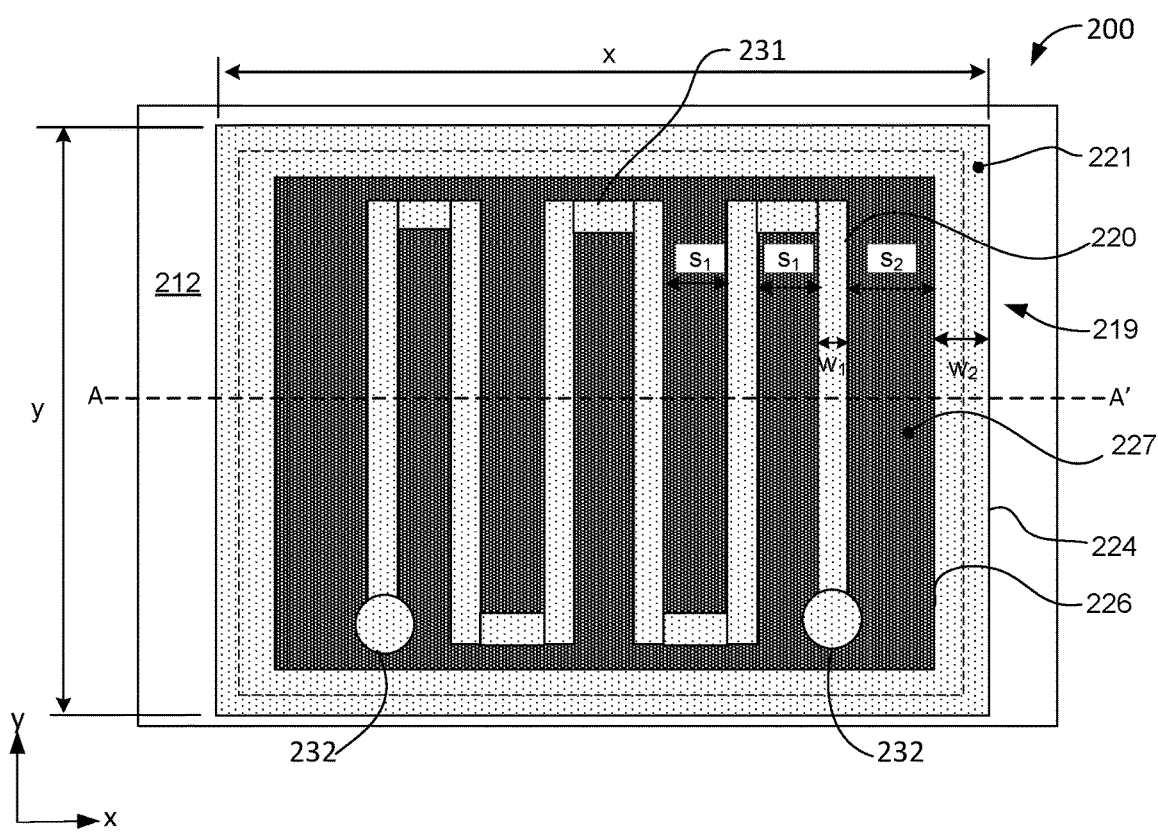

FIG. 2M illustrates a plan view in the x-y plane of metallization level N. Line A-A' across the plan view indicates the position of the cross-sectional plane illustrated in FIG. 2L. As shown in FIG. 2M, inductor traces 220 are a continuous serpentine trace structure 231 comprising a plurality of interconnected parallel segments. Inductor structure 219 is terminated by interconnect pads 232, beyond the A-A' plane. Interconnect pads 232 may be via caps, vertically interconnected to metallization in higher levels (e.g., N+1, etc.) and/or lower levels (e.g., N−1, etc.) within package substrate 200. Inductor traces 220 may be interconnected through lower metallization levels to package land pads at the bottom of package substrate 200 (not shown) for bonding to external circuitry (e.g., mounting in a socket or surface-mounted directly on a printed circuit board).

Ring structure 221 is shown as rectangular perimeter feature surrounding inductor trace 220). In the illustrated embodiment, inductor structure 219 is bounded by outer sidewall 224 of ring structure 221 within dielectric 212. In some embodiments, ring structure 221 is interconnected to other metallization features. As an example, ring structure 221 may be electrically grounded through vertical or lateral trace routing (not shown) coupled to a ground plane within the package substrate or on a printed circuit board electrically coupled to the package substrate. In some embodiments, ring structure 221 is electrically floating or may be connected to any reference voltage source.

FIGS. 3A-3G illustrate cross-sectional views of representative structures formed at different stages of an exemplary process flow for forming package substrate 300 comprising a package-embedded inductor according to some other embodiments of methods 100.

Figure 3A:
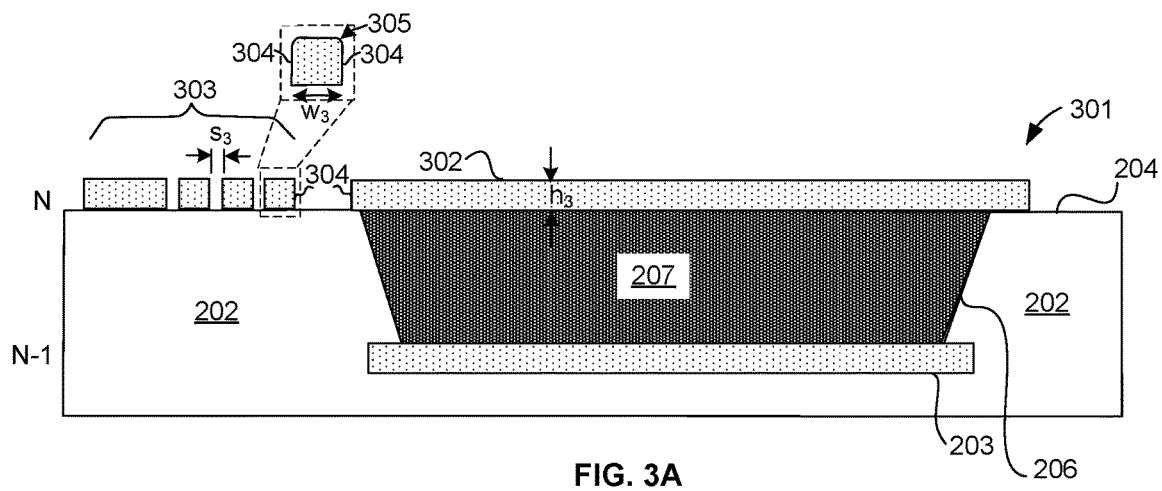
FIGS. 3A-3G illustrate cross-sectional views of representative structures formed at different stages of an exemplary process flow for forming a package substrate comprising a package-embedded inductor, according to some embodiments of the disclosure.

The process illustrated in FIG. 3A may be preceded by process operations similar to those shown FIGS. 2A-2D. Package substrate stack 301 may be obtained as an in-process structure as shown in FIG. 2C, for example. Description pertaining to metal and dielectric structures obtained and illustrated in FIG. 2A through FIG. 2C is therefore applicable to package substrate stack 301.

In FIG. 3A, preliminary metallization structure 302 and adjacent trace routing 303 are formed by a semi-additive process (SAP) at level N. An exemplary SAP may comprise deposition of a suitable metal (e.g., copper) into openings patterned into a lithographically-defined plating mask formed over surface 204 of dielectric 202 and magnetic material 207 in a previous operation. Preliminary metallization structure 302 and adjacent trace routing 303 may also be plated into lithographically-defined openings in a photoresist deposition mask formed over surface 204 in a previous operation (not shown). The electroplated structures may have a thickness $h_3$ ranging between 2 and 50 microns, s. Preliminary metallization feature 302 may have lateral dimensions in the x-y plane ranging between 500 microns and 20 mm, covering magnetic material 207 and extending beyond the top edge of magnetic material 207.

An enlarged view of preliminary metallization structure 302 and trace routing 303 is shown in the inset of FIG. 3A. Sidewalls 304 may have substantially vertical profiles as noted above as being indicative of a semi-additive process (e.g., a metal electroplating process). Upper edge 305 may have a rounded profile, as indicated in the inset. A separation between sidewalls 304 may be measured by a minimum spacing $s_3$ which may scale with technology node, but is generally smaller than minimum spacing achievable through subtractive processing.

Figure 3B:
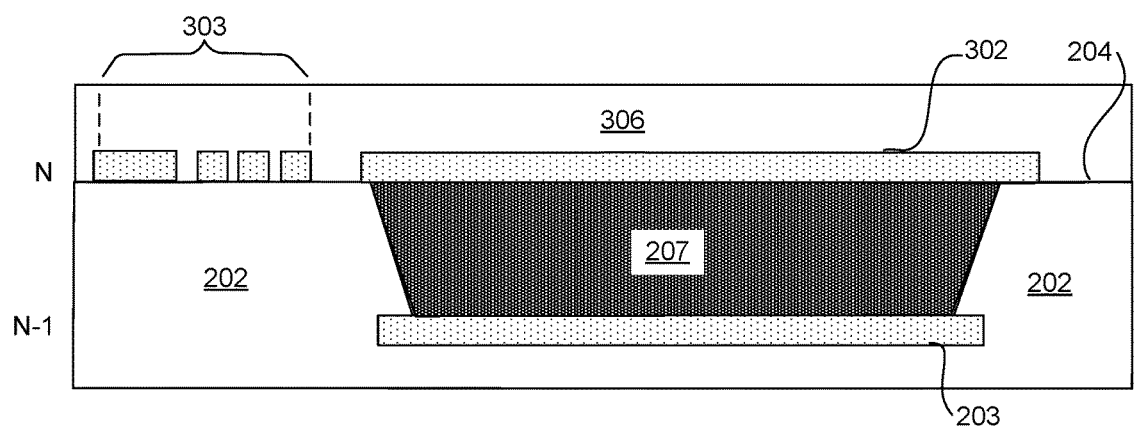

In FIG. 3B, dielectric 306 is formed over metallization structures and open dielectric surface 204. Dielectric 306 may be formed as described above. Dielectric 306 may be conformally laminated over surface 204 by a hot roller or hot vacuum lamination process, for example, filling spaces between metallization structures. Dielectric 306 may have a thickness ranging between 5 and 100 microns, for example.

Figure 3C:
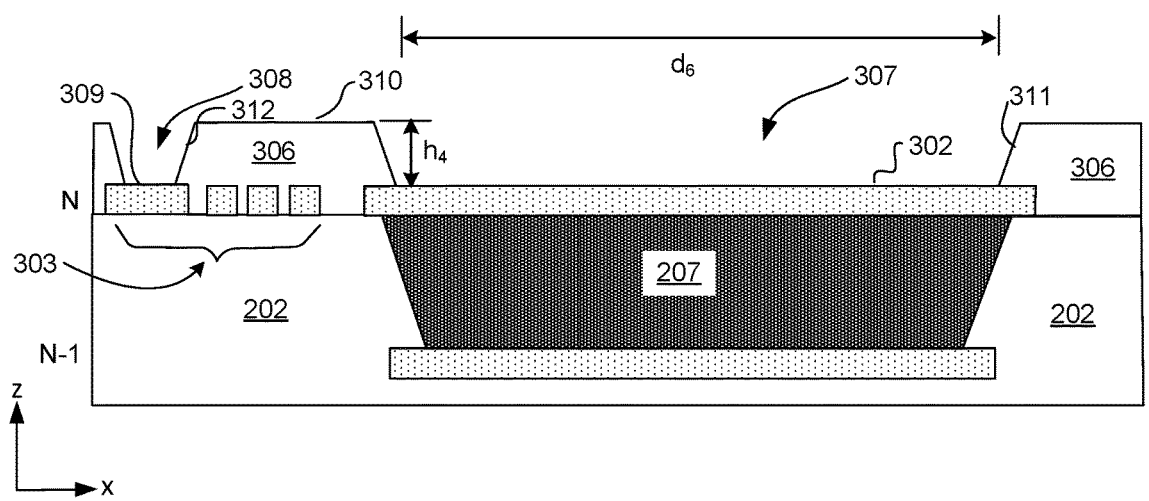

In FIG. 3C, aperture 307 and via opening 308 are formed in dielectric 306 over preliminary metallization feature 302 and pad 309, respectively. Aperture 307 may be formed by a laser drilling operation as described previously to a depth defined by distance $h_4$ between surface 310 and preliminary metallization feature 302. As mentioned above, preliminary metallization feature 302 may impede laser penetration into magnetic material 207. In other embodiments, aperture 307 may be formed by chemical etch methods. Sidewalls 311 may be have a slope between 45° and 85° from the plane of preliminary metallization feature 302, which may again be indicative of a laser drilling process. Aperture 307 may have at least one lateral dimension de (measured from the bottom of the aperture) ranging between 500 microns to 15 mm.

Via opening 308 may also be formed by a laser drilling operation to a depth of $h_3$ (e.g., 100 microns) exposing a portion of pad 309. Via opening 308 may also be instead formed by a suitable etch process in some alternative embodiments. Via opening 308 may have a round cross section in the x-y plane, but other suitable cross-sectional profiles are possible. In some embodiments, sidewalls 312 of via opening 308 may be sloped between 45° and 85°.

Figure 3D:
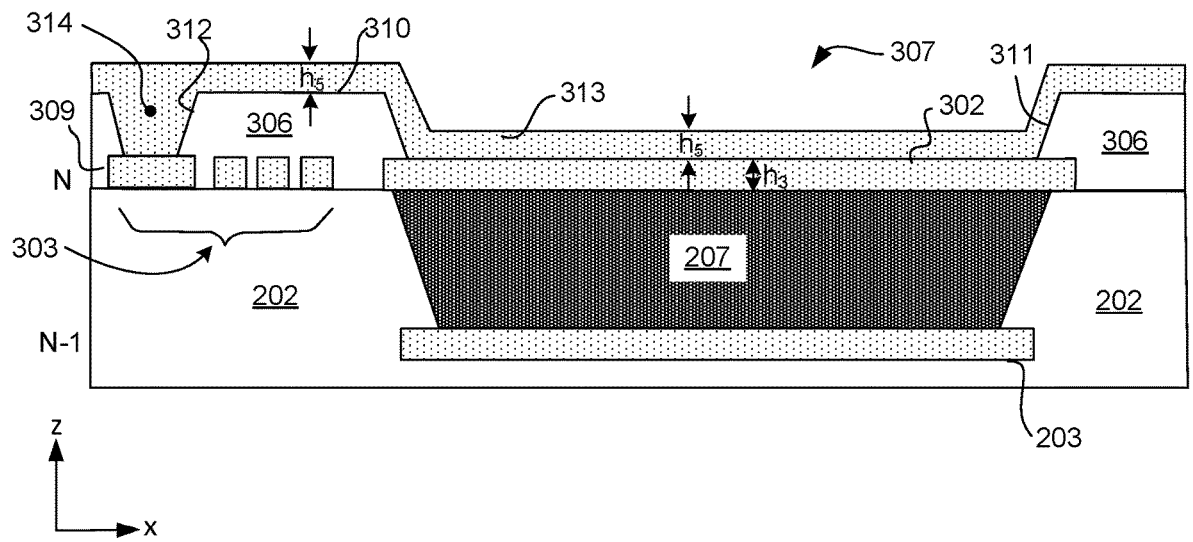

In FIG. 3D, metallization layer 313 is conformally deposited into aperture 307, via opening 308, the exposed portion of preliminary metallization feature 302 and surface 310 of dielectric 306. Copper or another suitable metal may be deposited by electrolytic or electroless deposition, for example, to fill via opening 308 and form via 314 over pad 309. Metallization layer 313 has a thickness $h_5$ (e.g., up to 50 microns thick) over surface 310 and preliminary metallization feature 302. The deposited metallization layer 313 may increase the metal thickness of the exposed portion of preliminary metallization feature 302 by approximately $h_5$. The increased thickness of metal at the bottom of aperture 307 may be advantageous for lower resistance of inductor traces.

Figure 3E:
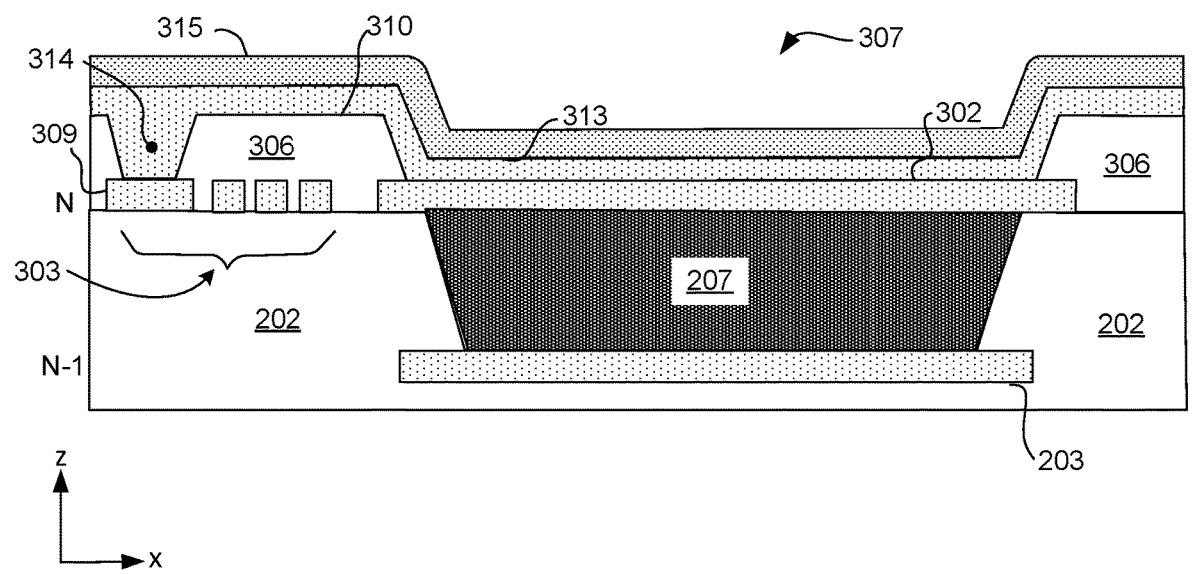

In FIG. 3E, photoresist 315 is deposited over metallization layer 313. In some embodiments, photoresist 315 is a dry film resist (DFR), laminated over metallization layer 313, for example, substantially as previously described.

Figure 3F:
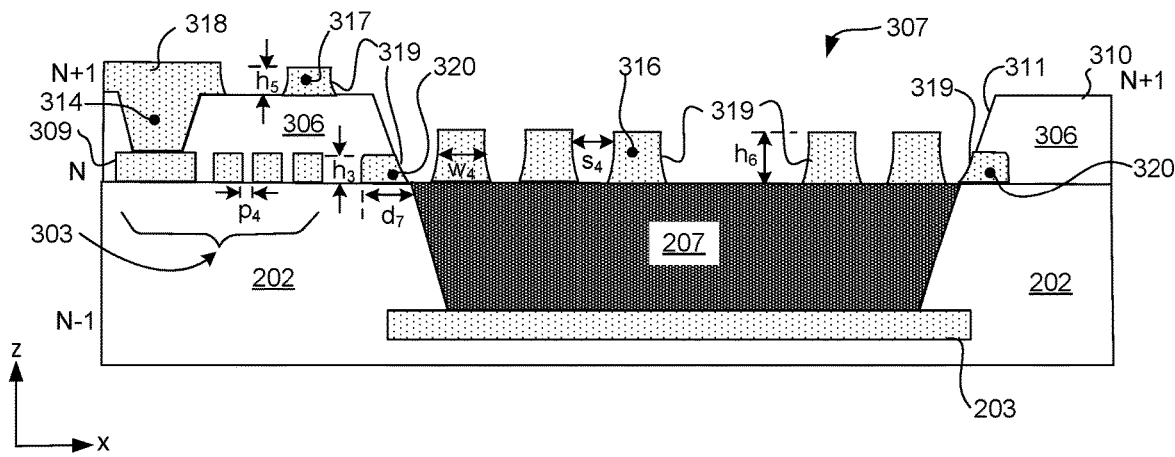

In FIG. 3F, metallization layer 313 is patterned by a subtractive process (e.g., by an isotropic wet chemical etch) defining features in metallization levels N and N+1 simultaneously. Metallization layer 313 is patterned into multiple inductor traces 316 in level N and trace routing 317 including via pad 318 in level N+1, created over surface 310 of dielectric 306. Inductor traces 316 may be a plurality of parallel traces interconnected to form one or more in-plane serpentine inductor wires. Sidewalls 319 may have a trapezoidal profile in the x-z plane indicative of an isotropic etch, as described earlier. Inductor traces 316 may have a thickness (e.g., z-height) of $h_6$, a width $w_4$ (e.g., 20-50 microns) and are separated by a minimum spacing $s_4$ (e.g., 20-50 microns). Z-height $h_6$ may be approximately the sum of $h_3$ and $h_5$. Minimum spacing $s_4$ of inductor traces 316 formed by a subtractive isotropic etch process may be significantly greater than minimum spacing $s_3$ of SAP structures 303 within the same N−1 metallization level.

Metallization structures in level N+1 such as trace routing 317 may have a thickness (z-height) $h_5$ as shown in the illustrated embodiment. Trace routing 317 will have some minimum pitch that can be expected to be significantly larger than that of features 303, and even larger than that of inductor traces 316 as a result of a difference in thicknesses $h_5$ and $h_6$. The larger thickness of inductor traces 316 compared to other metallization structures may lower inductor winding resistance.

Ring structure 320 is formed in level N concurrently with inductor traces 316. As shown in the FIG. 3F, ring structure 320 extends laterally under dielectric 306 a distance $d_7$ from sidewalls 311, where it is protected from chemical attack. Ring structure 320 is etched back to sidewall 311 of aperture 307. Inner sidewall 319 of ring structure 320 may have a concave profile indicative of an isotropic etch. Ring structure 320 may be etched completely to aperture sidewall 311, or a portion of ring structure 320 may remain within aperture 307. Width $w_3$ of ring structure 320 may depend on etch rate and duration. Ring structure 320 has a thickness $h_3 < h_6$. Ring structure 320 surrounds inductor traces 316, but may be electrically isolated from inductor traces 316. In some embodiments, ring structure 320 is interconnected to a ground plane or to ground metallization, and may provide a grounded guard ring around inductor traces 316, for example.

Figure 3G:
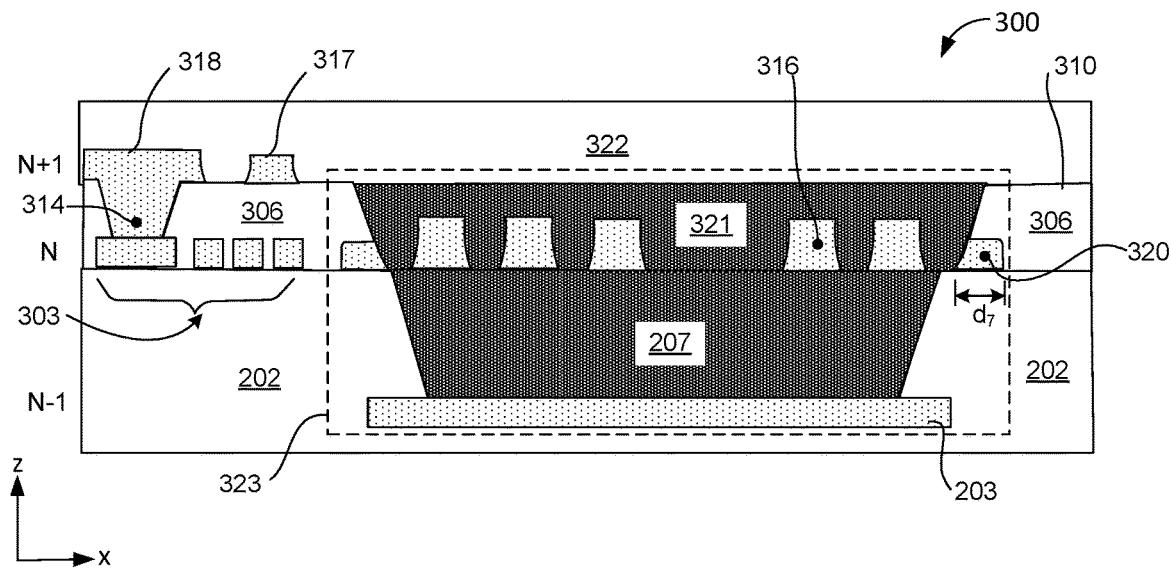

In FIG. 3G, magnetic material 321 is deposited into aperture 307, encapsulating inductor traces 316. Magnetic material 321 may be planarized with surface 310, as shown. In some embodiments, magnetic material 321 has substantially the same composition as magnetic material 207. Other suitable compositions are also possible. Magnetic material 307 may contact magnetic material 207 below inductor traces 316, forming a contiguous magnetic core encapsulating inductor traces 316. In some embodiments, inductor traces 316 interconnected to form a serpentine structure similar to inductor structure 231 shown in FIG. 2M. Ring structure 320 may extend across the interface between magnetic material 321 and adjacent dielectric 306 substantially as illustrated in FIG. 2M.

Dielectric 322 may be formed over surface 310, encapsulating metallization structures 317 and 318, as well as capping magnetic material 321 and dielectric 306 to complete package 300. Dielectric 322 may be a similar or the same package dielectric material described above, and may be laminated as previously described. In some embodiments, formation of dielectric 322 substantially completes fabrication of embedded inductor structure 323 (enclosed in the dashed outline).

FIGS. 4A-4G illustrate cross-sectional views of representative structures formed at different stages of an exemplary process flow for forming package substrate 400 comprising a package-embedded inductor, s according to some other embodiments of methods 100.

Figure 4A:
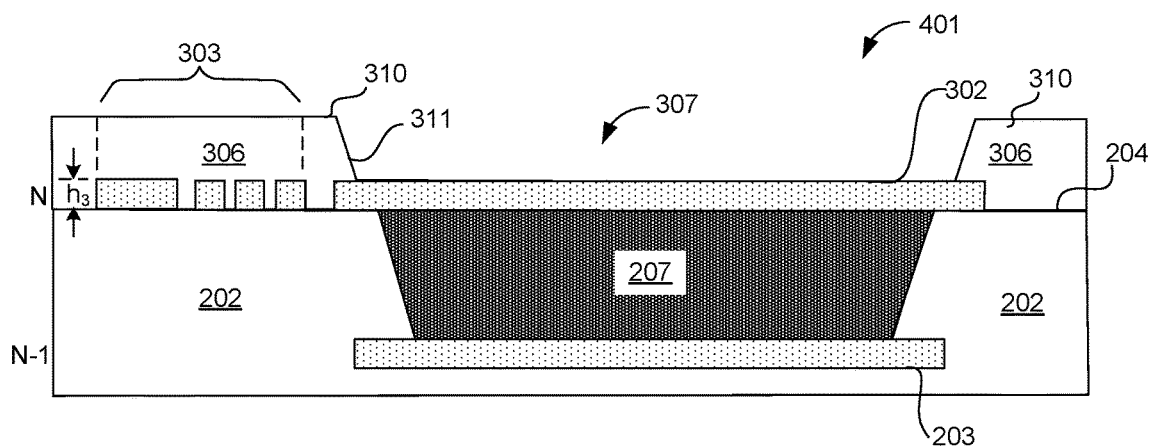
FIGS. 4A-4G illustrate cross-sectional views of representative structures formed at different stages of an exemplary process flow for forming a package substrate comprising a package-embedded inductor, according to some embodiments of the disclosure.

The process illustrated in FIG. 4A may be preceded by operations similar to those shown FIGS. 3A-3B. Package substrate stack 401 may be obtained in-process from the structure shown in FIG. 3B, for example. Description pertaining to metal and dielectric structures obtained and illustrated in FIG. 2A through FIG. 2C is therefore also applicable to the package substrate stack 401.

In FIG. 4A, package substrate stack 401 comprises substantially the same architecture as package substrate stack 301 in FIG. 3C, comprising dielectric 202, magnetic material 207 embedded within dielectric 202. Metallization feature 203 is in metallization level N−1 and directly below magnetic material 207. Trace routing 303 is coplanar with preliminary metallization feature 302 in metallization level N, where preliminary metallization feature 302 covers magnetic material 207. Aperture 307 may be formed by a laser drilling process, for example, exposing a portion of preliminary metallization feature 302 and forming sloped sidewalls 319 as described earlier. Level N metallization features, including preliminary metallization feature 302, and adjacent coplanar trace routing 303 may be formed by a previous semi-additive plating process. In the illustrated example, preliminary metallization feature 302 and trace routing 303 have substantially vertical sidewalls. Features in level N (e.g., preliminary metallization feature 302 and adjacent trace routing 303) may have a thickness of $h_3$ (e.g., a z-height of 5-50) microns).

Figure 4B:
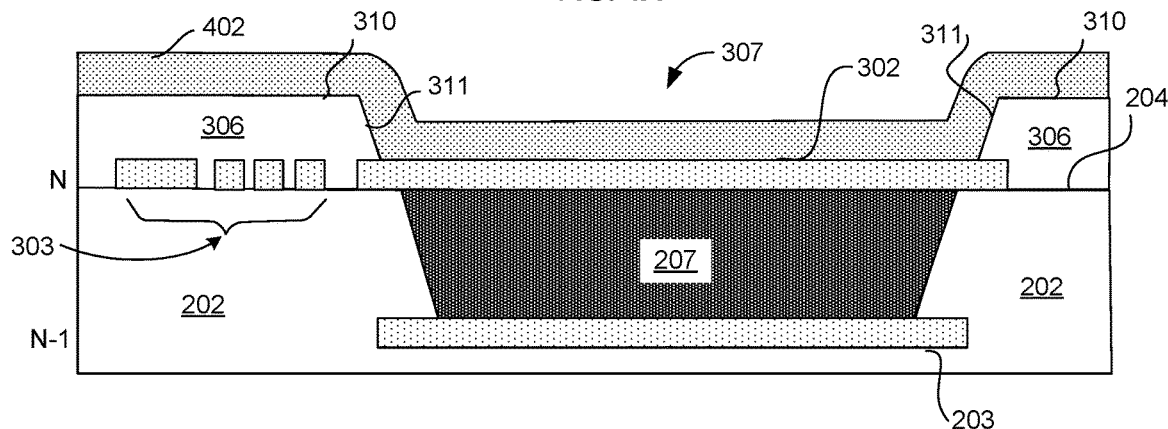

In FIG. 4B, a photoresist 402 is conformally applied over surface 310, covering sidewalls 319 and preliminary metallization feature 302. In some embodiments, photoresist 402 is a DFR laminated as described earlier and having a thickness between 10 and 100 microns, for example.

Figure 4C:
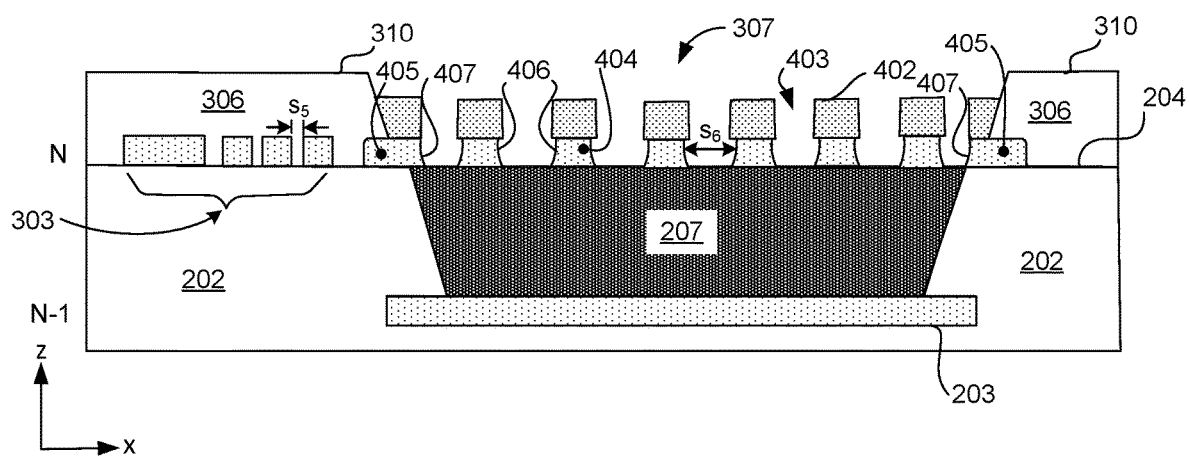

In FIG. 4C, photoresist 402 has been patterned into an etch mask comprising openings 403. Inductor traces 404 and ring structure 405 may be formed by an isotropic etch through openings 403. Inductor traces 404 and surrounding ring structure 405 have concave sidewalls 406 and 407, respectively. Inductor traces 404 are separated by a minimum spacing $s_6$ as shown. Spacing $s_6$ may be significantly greater than minimum spacing $s_5$ between adjacent trace routing structures 303.

Figure 4D:
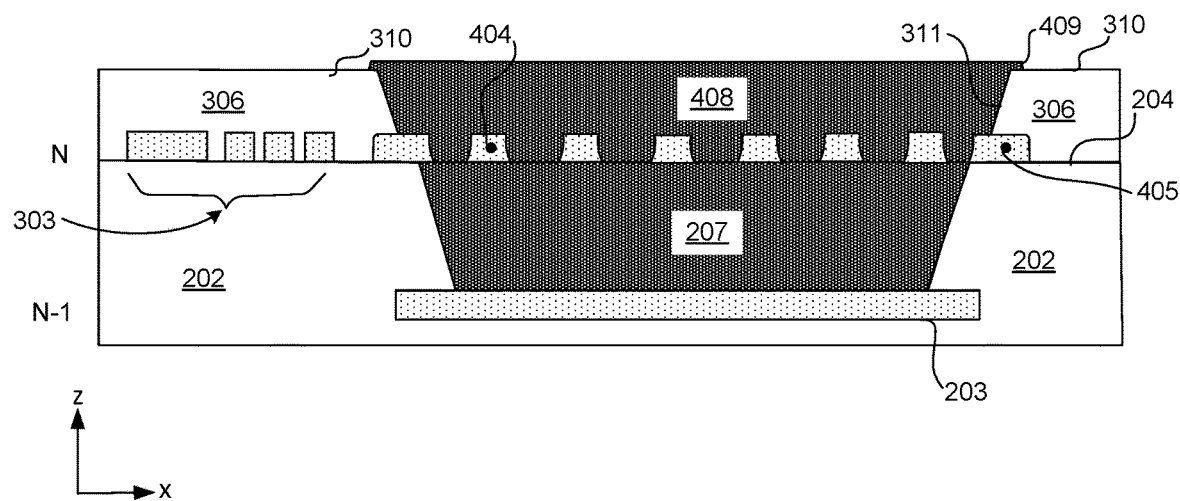

In FIG. 4D, magnetic material 408 is deposited into aperture 307, encapsulating traces 404. Magnetic material 408 is shown to overflow sidewalls 319, forming overhangs 409 extending over adjacent regions of dielectric 306. Magnetic material 408 may comprise substantially the same material as magnetic material 207, for example. Magnetic material 408 may extend between inductor traces 404 to contact magnetic material 207 below inductor traces 404, forming a contiguous magnetic core fully encapsulating inductor traces 404.

Figure 4E:
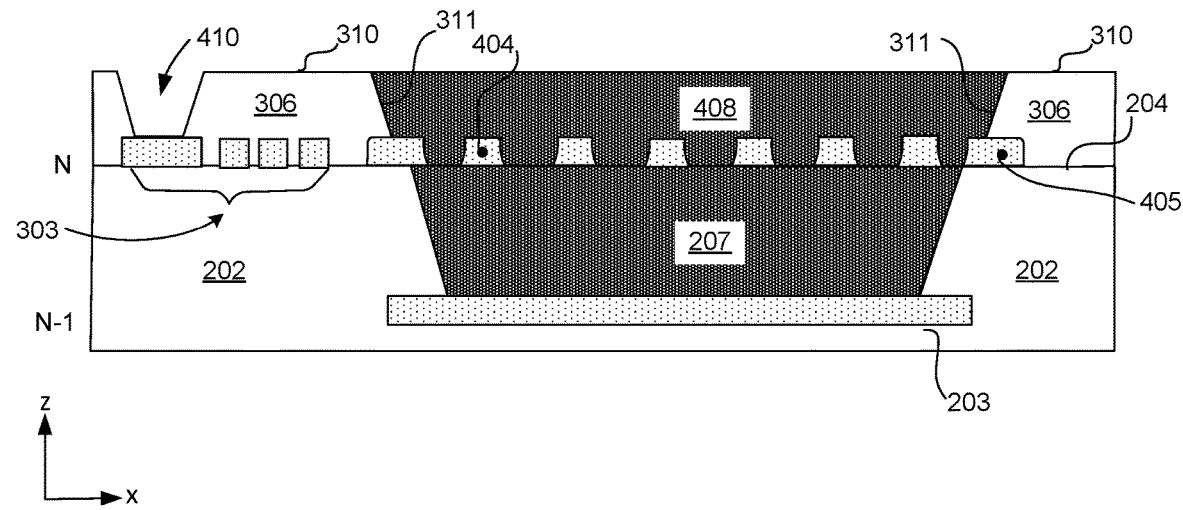

In FIG. 4E, via opening 410 is formed in dielectric 306 adjacent to sidewall 315. Via opening 410 may be formed by a laser drilling operation as described previously. Magnetic material 408 may be planarized with overhangs 409 before formation of via opening 410.

Figure 4F:
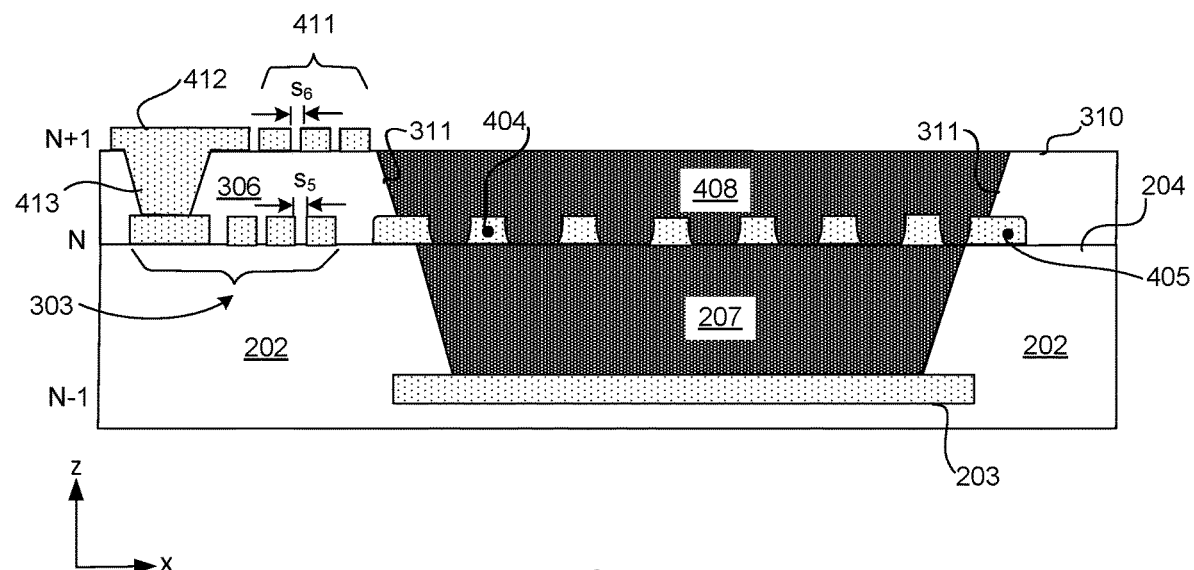

In FIG. 4F, level N+1 trace routing 411 may be formed by a semi-additive plating process over surface 310 adjacent to sidewall 311 and adjacent to via pad 412 over via 413. Via opening 410 may be filled to form via 413 by an electrolytic or electroless process before formation of structures 411 and 412. As a result of differences in feature resolution between subtractive and SAP fabrication techniques, trace routing 411 in level N+1 may have a minimum spacing $s_6$ similar or the same as spacing $s_5$ of trace routing 303 in level N.

Figure 4G:
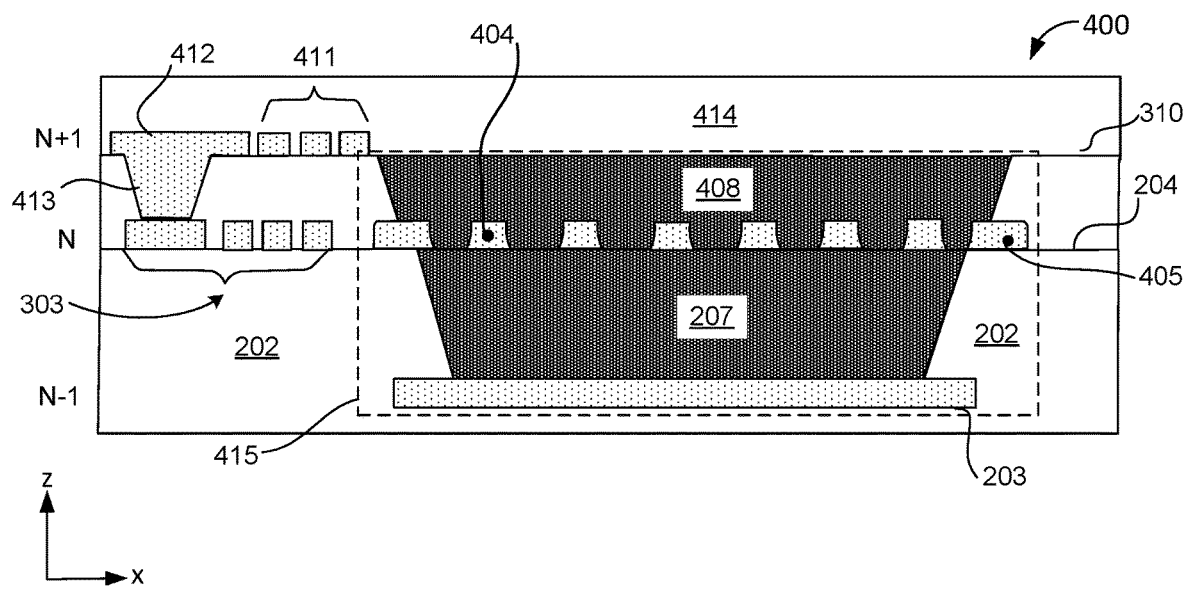

In FIG. 4G, dielectric 414 is laminated over metallization level N+1, magnetic material 408 and surface 310, substantially completing formation of embedded inductor structure 415 (enclosed within the dashed outline). Inductor structure 415 comprises magnetic materials 207 and 408 encapsulating inductor traces 404.

FIGS. 5A-5G illustrate cross-sectional views of representative structures formed at different stages of an exemplary process flow for forming package substrate 500) comprising a package-embedded inductor, according to some other embodiments of methods 100.

Figure 5A:
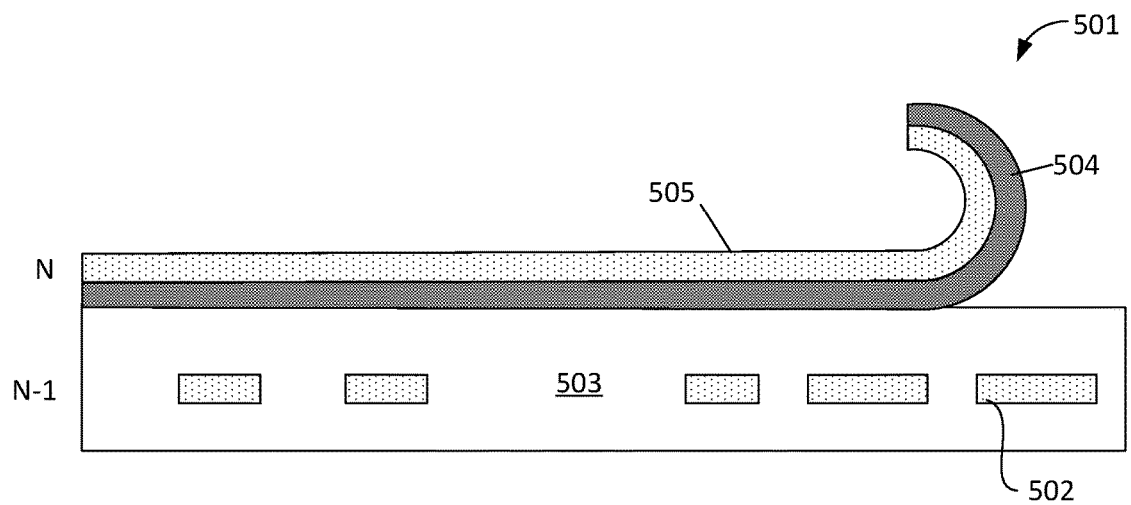
FIGS. 5A-5G illustrate cross-sectional views of representative structures formed at different stages of an exemplary process flow for forming a package substrate comprising a package-embedded inductor, according to some embodiments of the disclosure.

In FIG. 5A, package substrate stack 501 comprising metallization features 502 embedded within dielectric 503 at level N−1. Magnetic material is incorporated onto package substrate stack 501 as a layer in a multi-layered sheet of foil laminated over dielectric 503. The multi-layered foil 4 comprises a sheet of high magnetic permeability material 504, such as nickel-iron (NiFe) or nickel-cobalt (NiCo) alloys, having a relative magnetic permeability ranging between 10,000 and 30,000, for example. Magnetic material 504 may have a thickness ranging between 5 and 500 microns, and may be bonded a non-magnetic material 505, which may also have a thickness ranging between 5 and 500 microns, for example. Non-magnetic material 505 may be copper or another conductive material suitable as metallization level N of package substrate stack 501.

Figure 5B:
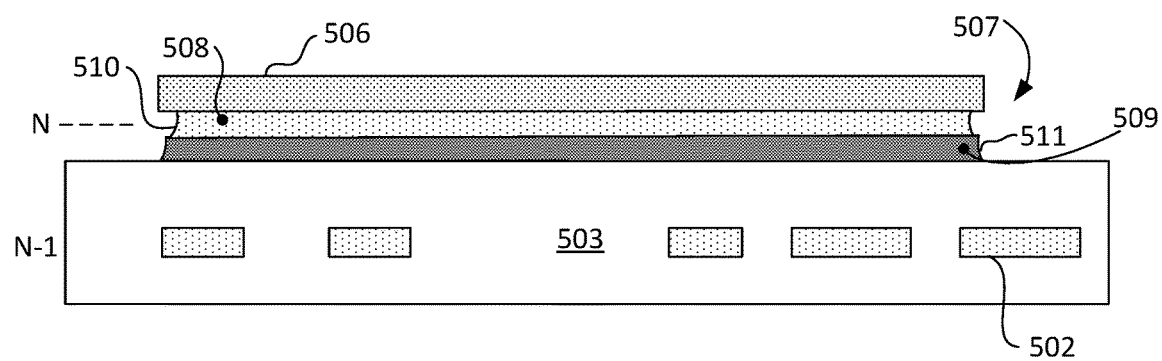

In FIG. 5B, photoresist 506 has been applied over the multi-layered foil and patterned. Photoresist 506 may be a DFR or a liquid resist. A suitable etch process may etch through at least non-magnetic material 505 and may further etch through magnetic material 504 where that material has significant electrical conductivity (e.g., NiFe, NiCo, etc.). As shown, patterned structure 507 comprises the preliminary metallization feature 508 etched from non-magnetic material 505 over a magnetic material feature 509, etched from magnetic material 504. Preliminary metallization feature 508 and magnetic foil feature 509 may have lateral dimensions ranging between 500 microns to 20 mm, for example. A suitable etch process, such as an acidic and/or oxidizing wet etch bath, may be employed to attack metals in both materials. Etch rates may be similar for both foils. In the illustrated example, an isotropic wet etch has been employed, creating undercut concave sidewalls 510 and 511 for preliminary metallization feature 508 and magnetic foil feature 509, respectively. As the etch rates for the different materials may vary, the amount of sidewall recess shown in the example for each foil differs slightly, indicated by the lateral displacement of sidewalls 510 and 511.

Figure 5C:
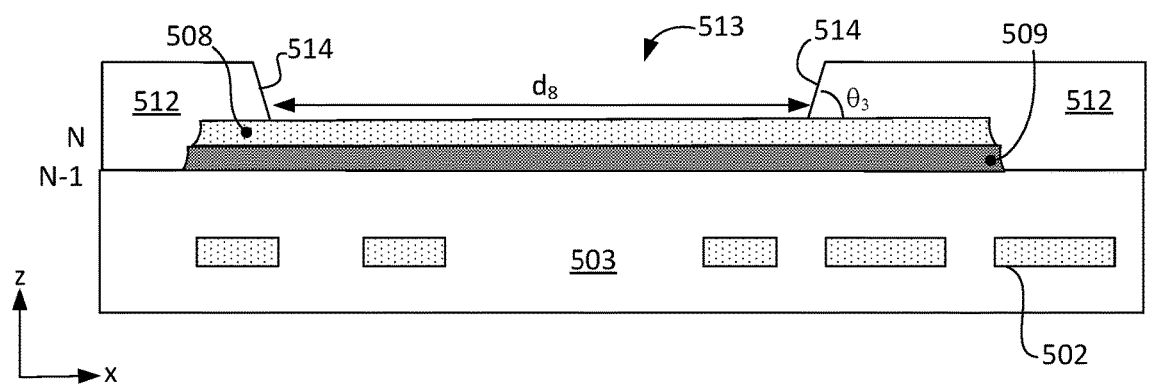

In FIG. 5C, dielectric 512 is formed over dielectric 503 and preliminary metallization feature 508 by a lamination process as previously described, or by another suitable method. Aperture 513 is formed over preliminary metallization feature 508 by laser drilling methods or by an etch process, as described above. Formation of aperture 513 may expose a portion of preliminary metallization feature 508 at the bottom of aperture 513. The exposed portion of preliminary metallization feature 508 may have a lateral dimension (e.g., length) $d_8$ ranging between 500 microns to 15 mm, for example. Aperture 513 comprises sidewalls 514. In some embodiments, sidewalls 514 are sloped at an angle $\theta_3$ (e.g., 45°) to 85° with respect to the plane of preliminary metallization feature 508.

Figure 5D:
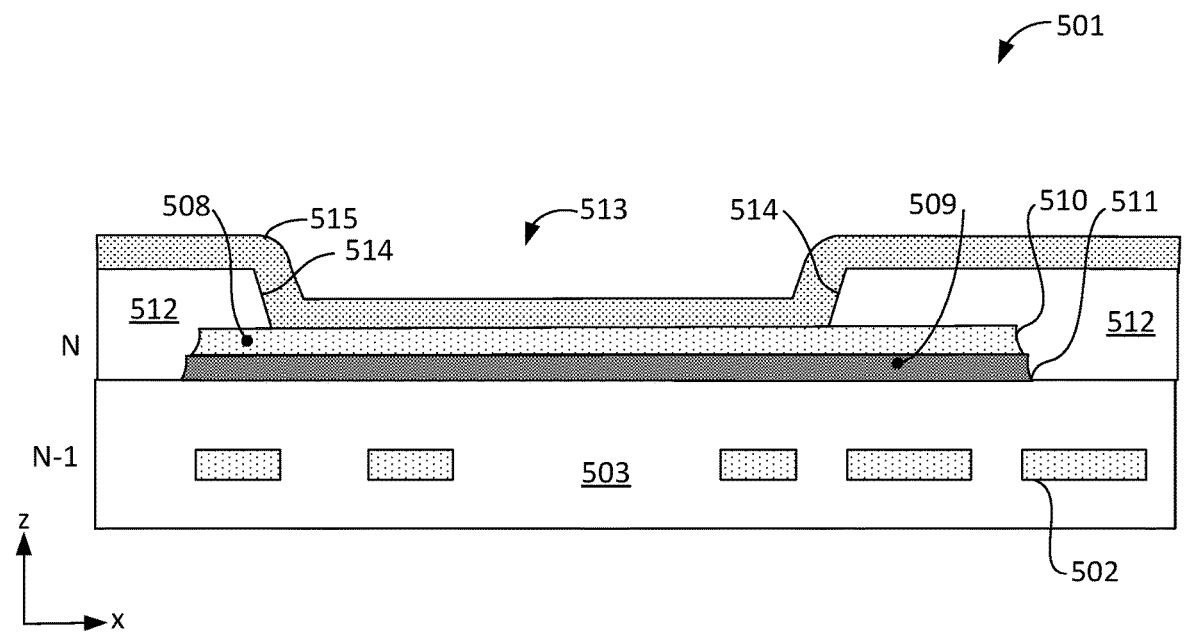

In FIG. 5D, photoresist 515 may be conformally applied over package substrate stack 501, covering dielectric 512, sidewalls 514 of aperture 513 and preliminary metallization feature 508. Photoresist 515 may be a DFR laminate, for example. Photoresist 515 may be patterned to form an etch mask over preliminary metallization feature 508 and magnetic foil feature 509.

Figure 5E:
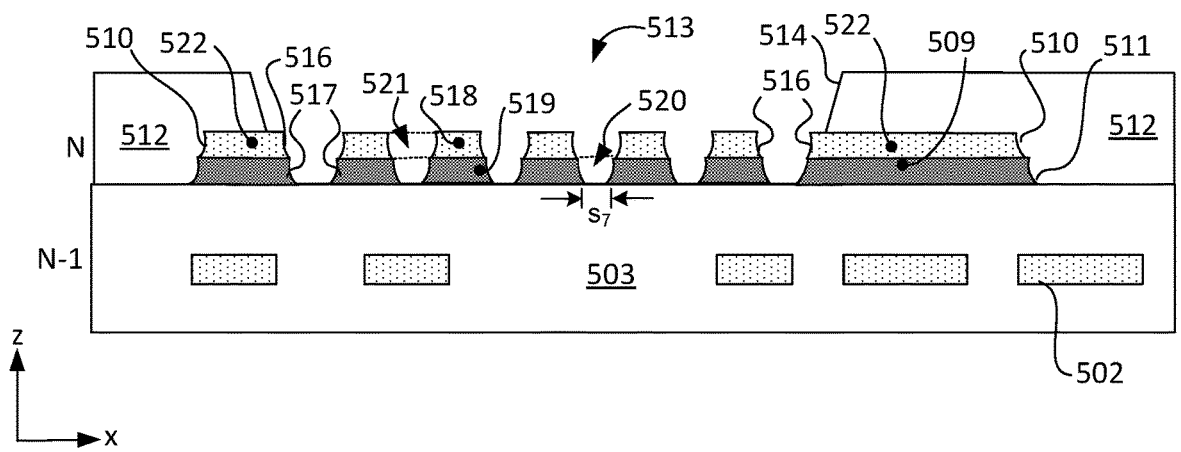

In FIG. 5E, lithographically defined stripes and openings in photoresist 515 (not shown) have been transferred to preliminary metallization feature 508 and magnetic foil feature 509. Both structures have been patterned simultaneously by an isotropic wet etch, for example, forming concave sidewalls 516 and 517 respectively for the plurality of etched copper inductor traces 518 and magnetic strips 519 underlying inductor traces 518. Sidewalls 516 and 517 may have substantially the same profile as sidewalls 510 and 511, respectively, obtained in the lithographic process illustrated in FIG. 5B. Inductor traces 518 may have a separation represented by minimum spacing $s_7$ (e.g., 5 to 50 microns). Openings 520 have been etched in magnetic foil feature 509 to form the plurality of magnetic strips 519 below inductor traces 518, exposing portions of dielectric 503 between magnetic strips 519. Openings 520) (delineated by dashed outline) coincide with spaces 521 between inductor traces 518 (also so delineated).

Ring structure 522 is formed at the perimeter of the copper foil that is separated from inductor traces 518 by the patterning process. A portion of ring structure 522 and underlying magnetic material 509 extends from sidewall 514 through dielectric 512. Ring structure 522 has outer sidewalls 510 formed in the etch process illustrated in FIG. 5B (e.g., before formation of dielectric 512), and inner sidewalls 516 obtained during the formation of inductor traces 518. In some embodiments, ring structure 522 may be interconnected to inductor traces 518. In some embodiments, ring structure 522 is electrically isolated from inductor traces 518. In the illustrated embodiment, ring structure 522 extends asymmetrically from aperture sidewalls 514, for example, to provide a landing pad for a vertical interconnect, as described below.

Figure 5F:
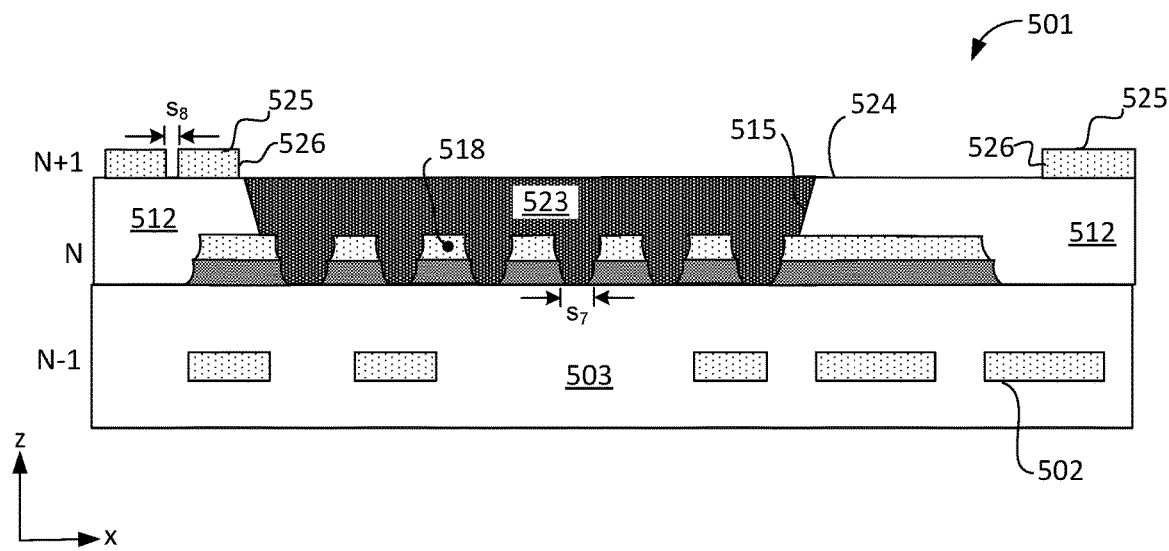

In FIG. 5F, magnetic material 523 is deposited in aperture 513. In some embodiments, magnetic material 523 may have a similar or substantially identical composition to magnetic materials described earlier (e.g., magnetic material 207). Magnetic material 523 has a different composition than that of magnetic strips 519. Magnetic material 523 may be deposited by ink jet or screen printing methods, for example as described above. In the illustrated embodiment, magnetic material 523 is planar with surface 524 of surrounding dielectric 512. A grind and polish operation (not shown) may have followed deposition and curing of magnetic material 523 for planarization with the surrounding dielectric 512.

Magnetic material 523 may extend through openings 520 and spaces 521 to the floor of (former) aperture 513, contacting the upper surface of dielectric 503, encapsulating inductor traces 518 within magnetic material and electrically isolating high-permeability magnetic strips 519. Inductor traces 518 are fully encapsulated in magnetic materials by both magnetic strips 519 (below) and magnetic material 523 (above and adjacent to sidewalls).

In subsequent operations, metallization features 525 are formed at level N+1 on surface 524. Metallization features 525 may be formed by a semi-additive process, for example by plating copper or another suitable metal through a plating mask, for example as described above. Sidewalls 526 of metallization features 525 may be substantially vertical (slope of 10° or less), and may have a rounded upper edge, indicative of a semi-additive formation of metal structures by deposition into a plating mask. Metallization features 525 may have a minimum spacing $s_8$ smaller than minimum spacing $s_7$ between inductor traces 518 in level N.

Figure 5G:
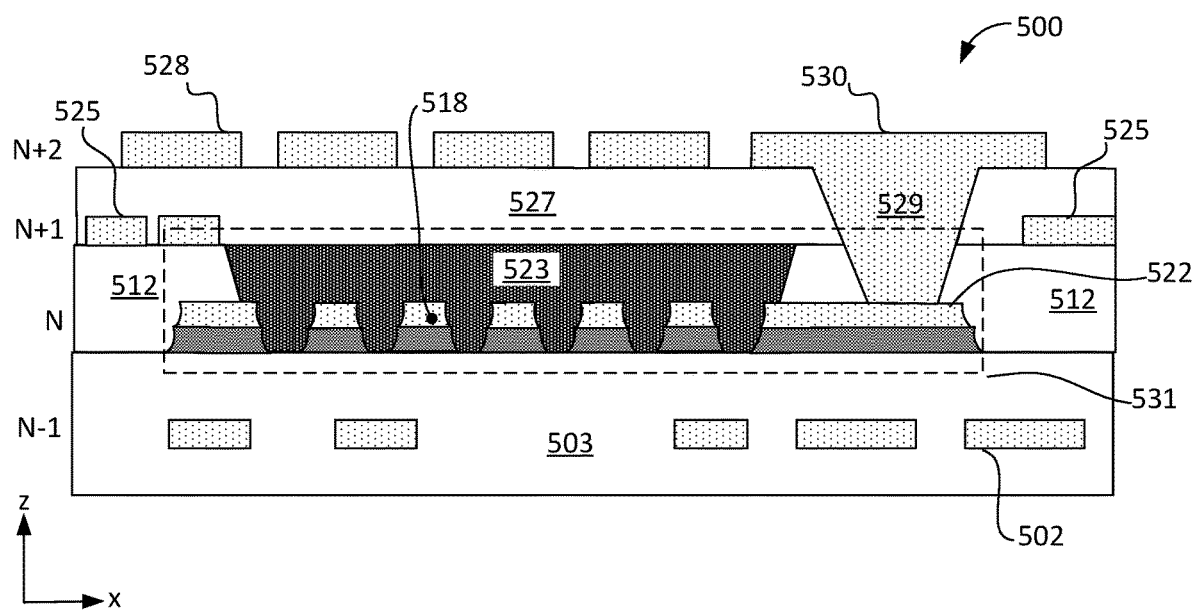

In FIG. 5G, dielectric 527 is formed over package substrate stack 501, covering dielectric 512, metallization features 525. Magnetic material 523 is capped by dielectric 527 and completely embedded within package substrate stack 501. In subsequent operations, level N+2 metallization features 528 are formed over dielectric 527. Metallization features 528 may be formed by a semi-additive plating process (or by a subtractive metal etch process) to form, for example, top level interconnect pads that may receive solder bumps or other interconnects. Via 529 may be formed by plating into an opening formed in both dielectrics 527 and 512 that expose a portion of ring structure 522. Via 529 interconnects ring structure 522 (in level N) and level N+2 metallization. A via cap 530 may be formed simultaneously with metallization features 528. In some embodiments, formation of level N+2 metallization features substantially completes formation of package substrate 500. In the illustrated example, via 529 interconnects ring structure 522 to top metallization level N+2. Ring structure 522 may be interconnected to an external ground circuit (e.g., on a printed circuit board) through via 529.

As shown in the illustrated embodiment, magnetic strips 519 have a significantly smaller z-height than magnetic material 523, and may occupy a relatively small portion of a magnetic core comprising both magnetic material 523 and magnetic strips 519. The high magnetic permeability of magnetic strips 519 may dominate the overall magnetic permeability of the magnetic core (e.g., comprising magnetic material 523 and magnetic strips 519) of inductor structure 531, shown in the illustrated embodiment as the structure enclosed within the dashed outline. The permeability of the composite core may be thousands of times greater than the permeability of magnetic material 523 alone. The greatly increased permeability may reduce the z-height requirement of the composite core structure, reducing the overall z-height of package substrate 500.

Figure 6A:
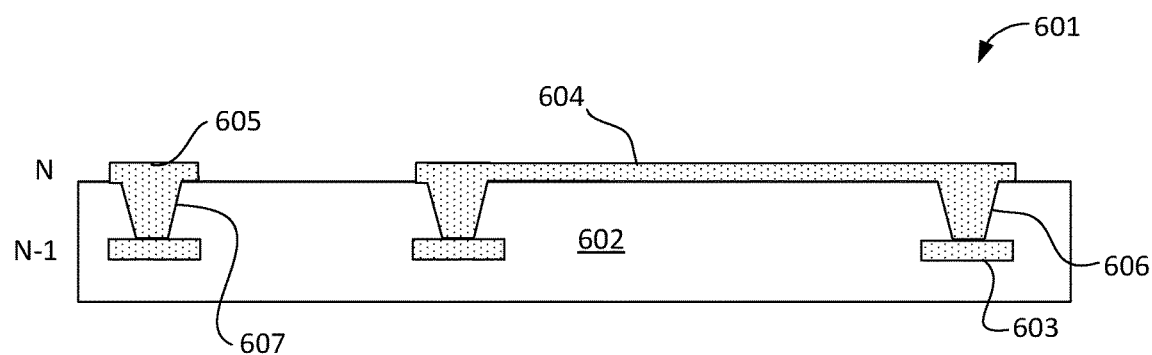
FIGS. 6A-6R illustrate cross-sectional views of representative structures formed at different stages of an exemplary process flow for forming a package substrate comprising a package-embedded inductor, according to some embodiments of the disclosure.
Figure 6B:
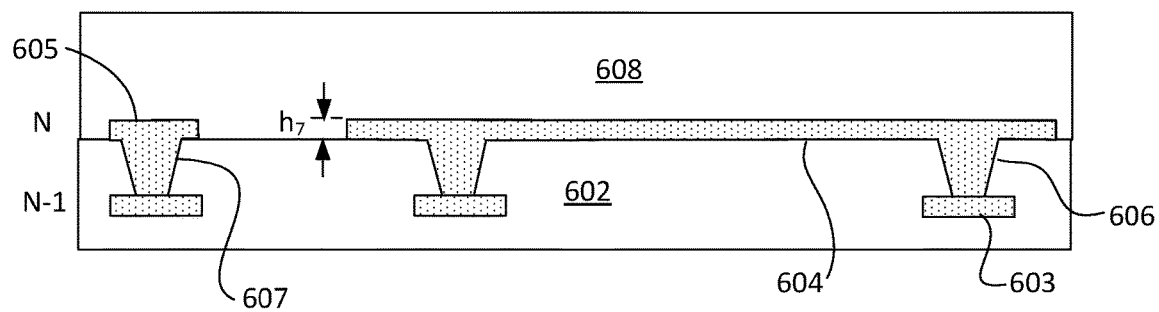
Figure 6C:
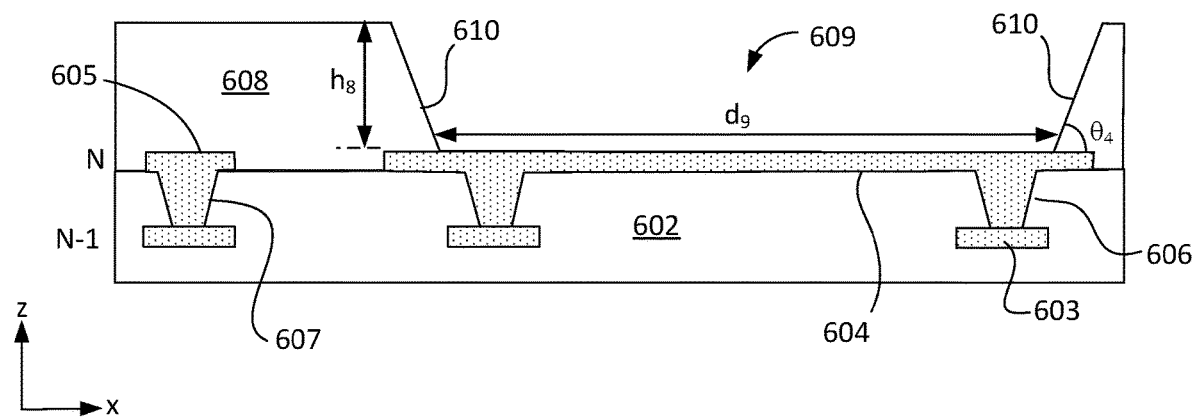
Figure 6D:
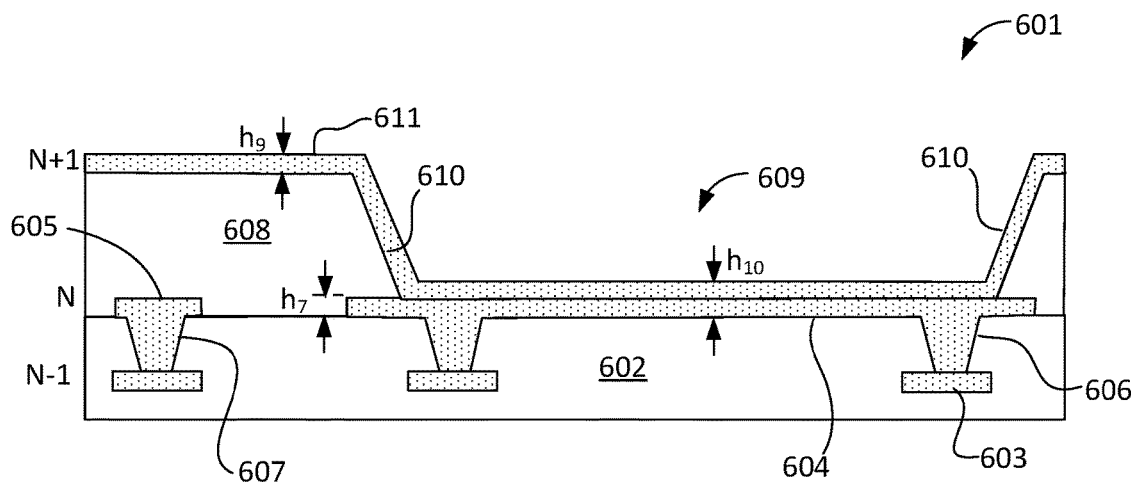
Figure 6E:
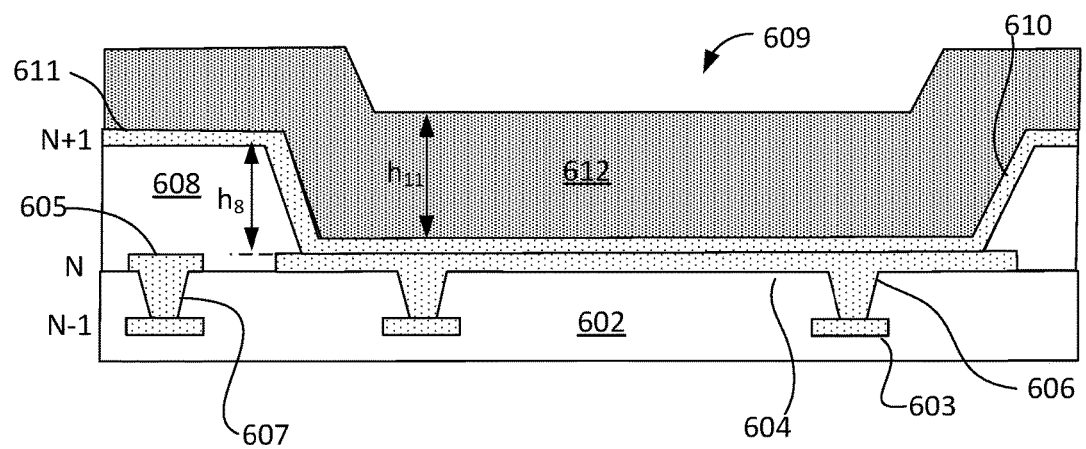
Figure 6F:
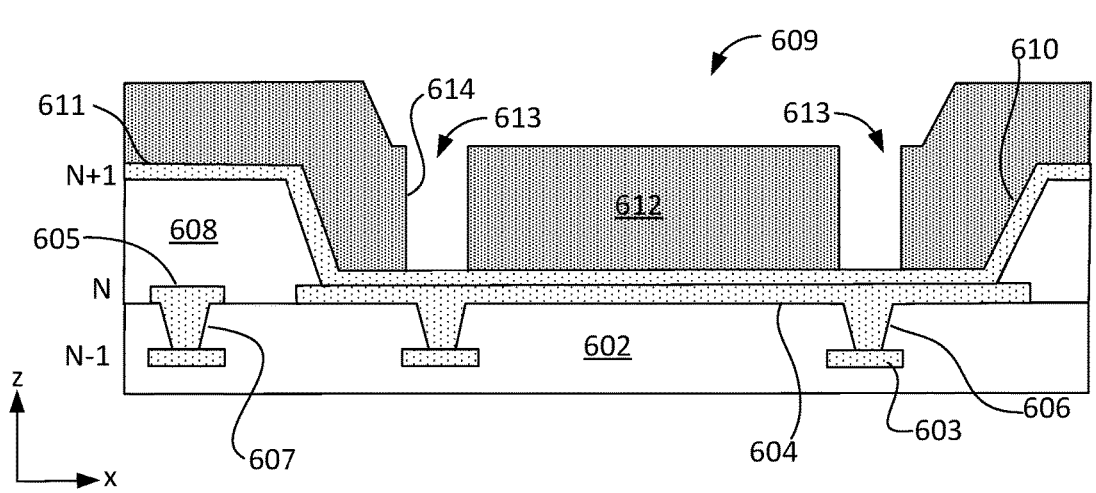
Figure 6G:
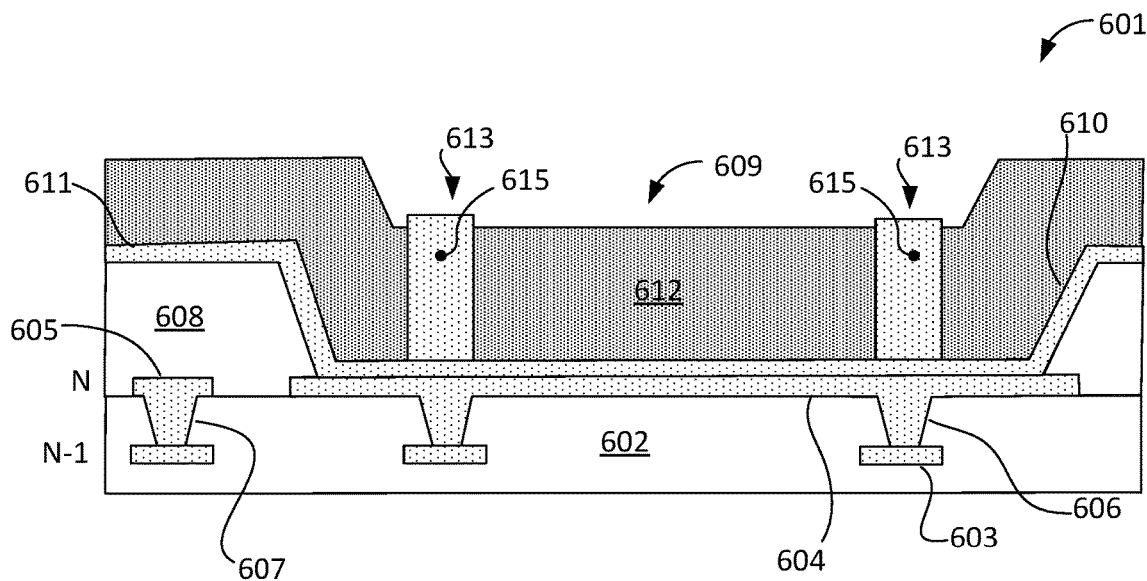
Figure 6H:
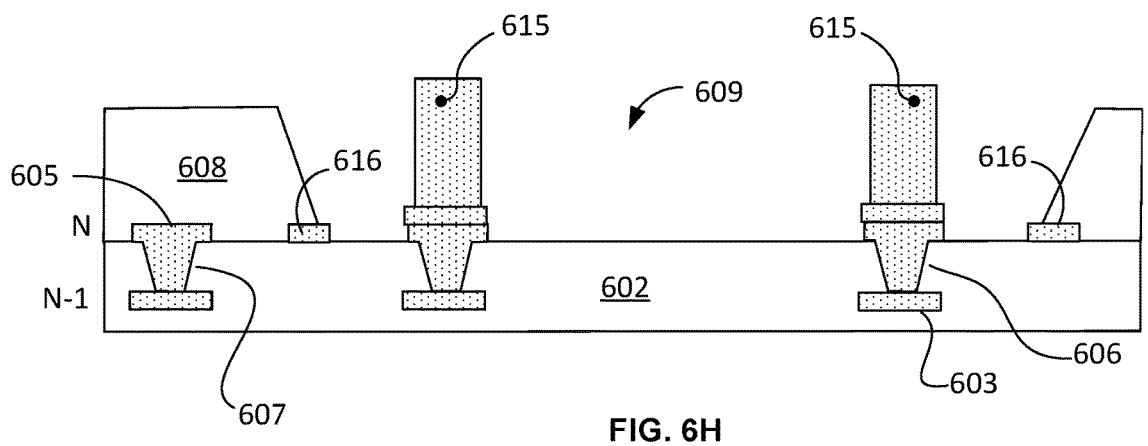
Figure 6I:
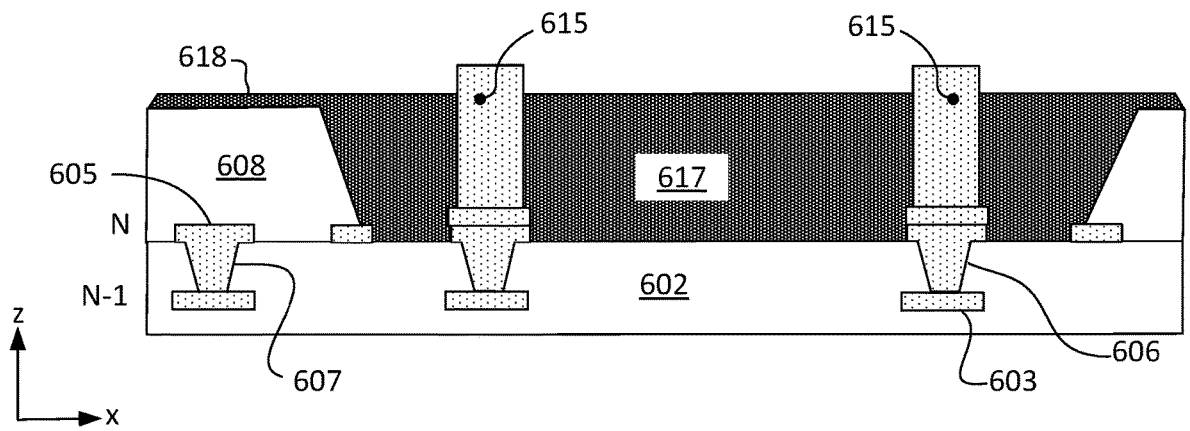
Figure 6J:
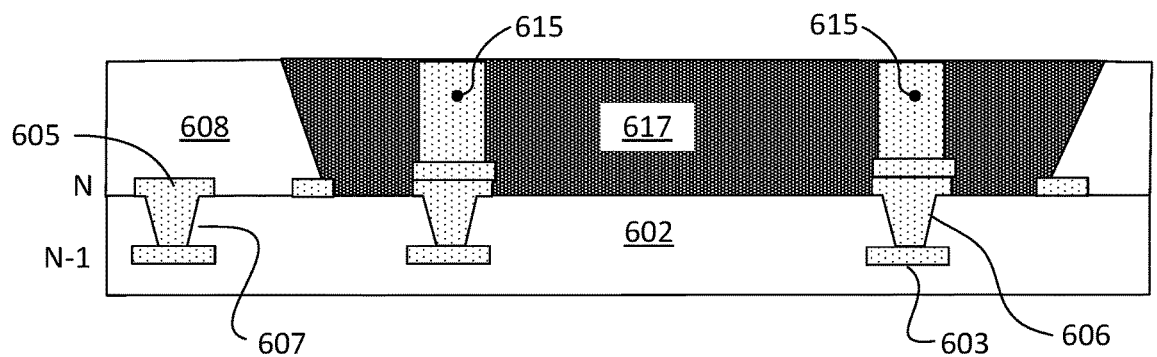
Figure 6K:
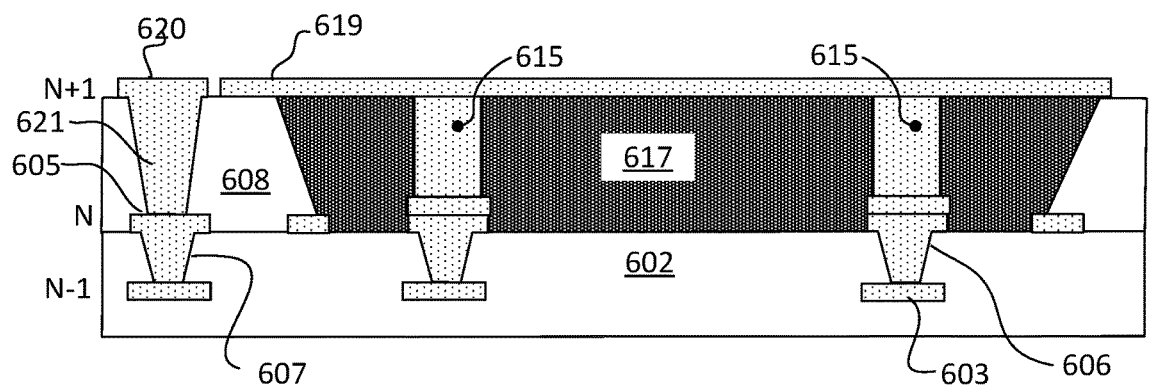
Figure 6L:
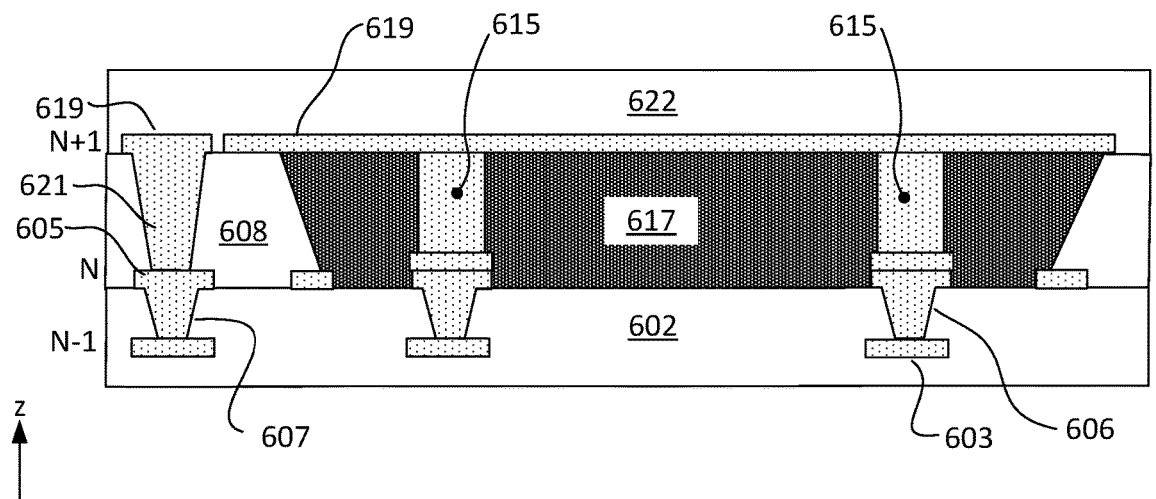
Figure 6M:
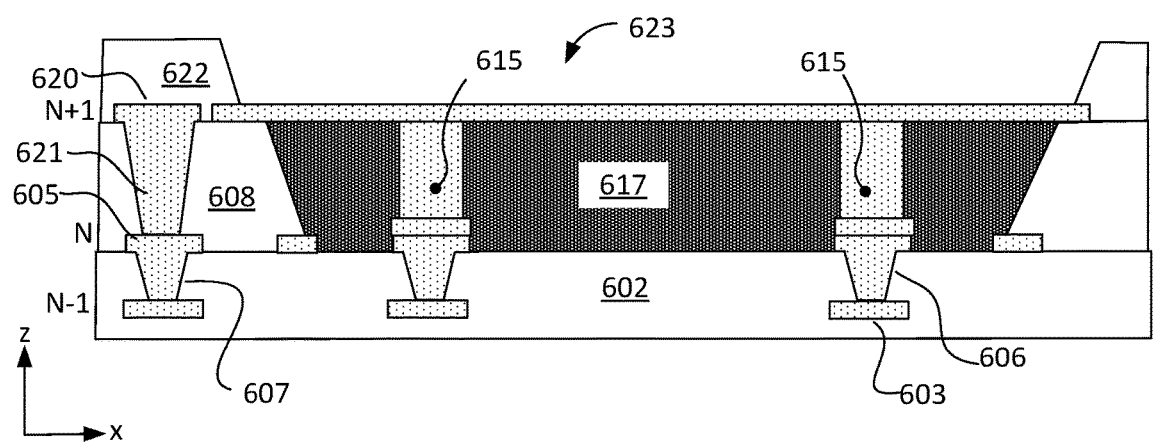
Figure 6N:
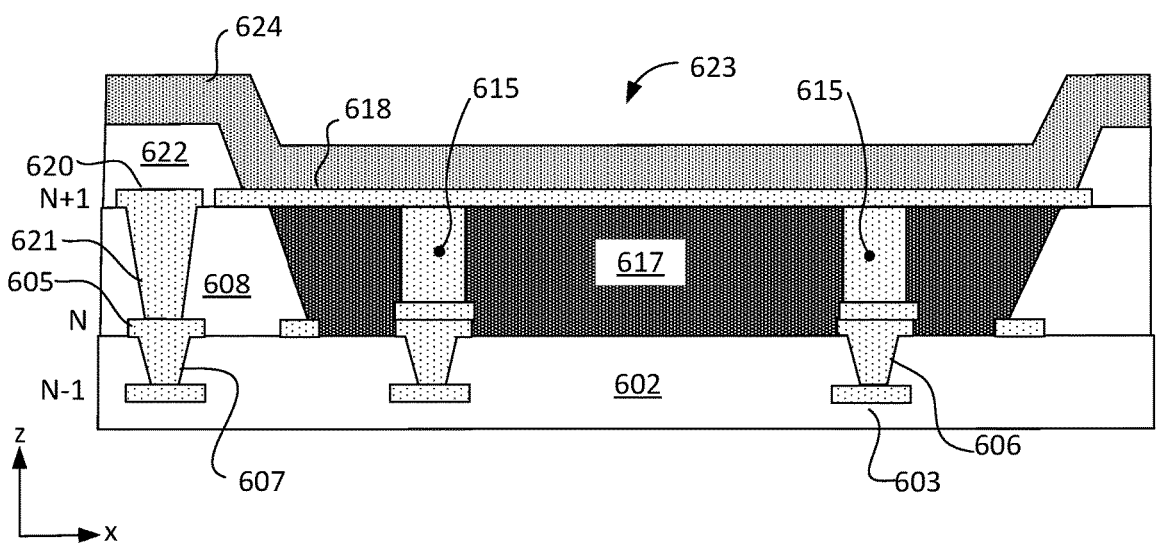
Figure 6O:
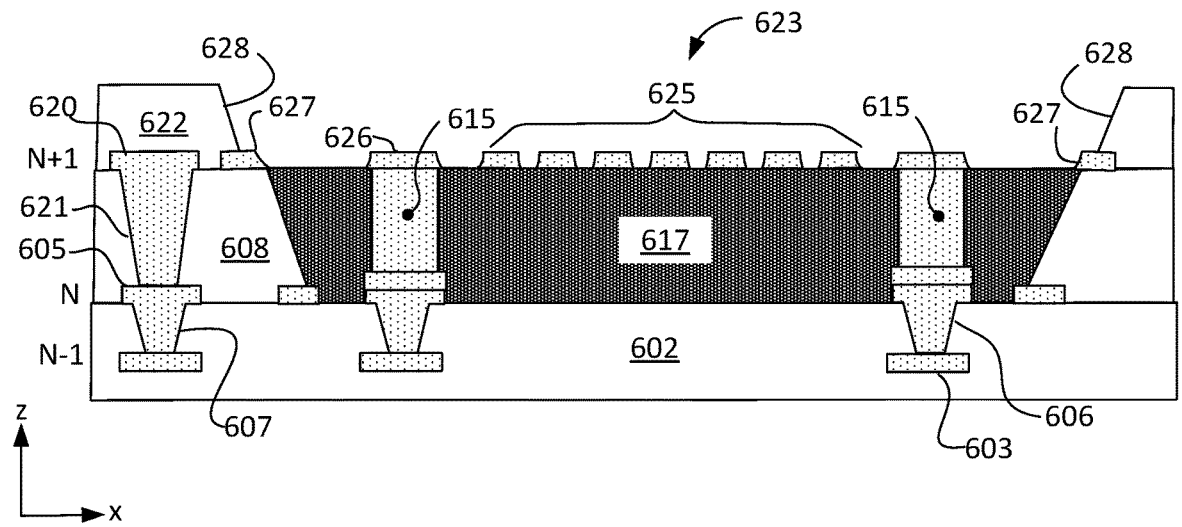
Figure 6P:
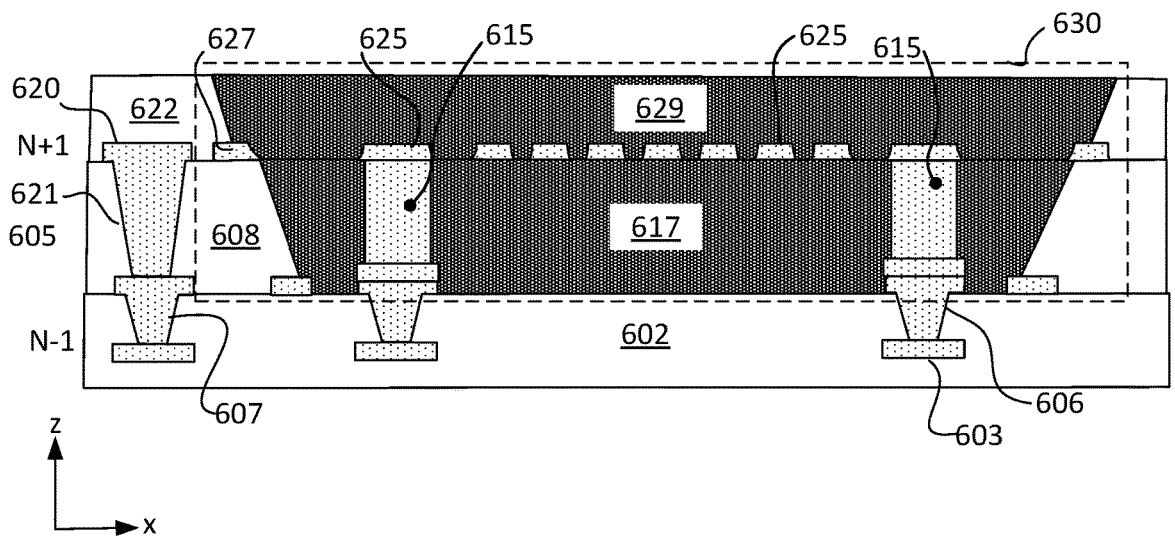
Figure 6Q:
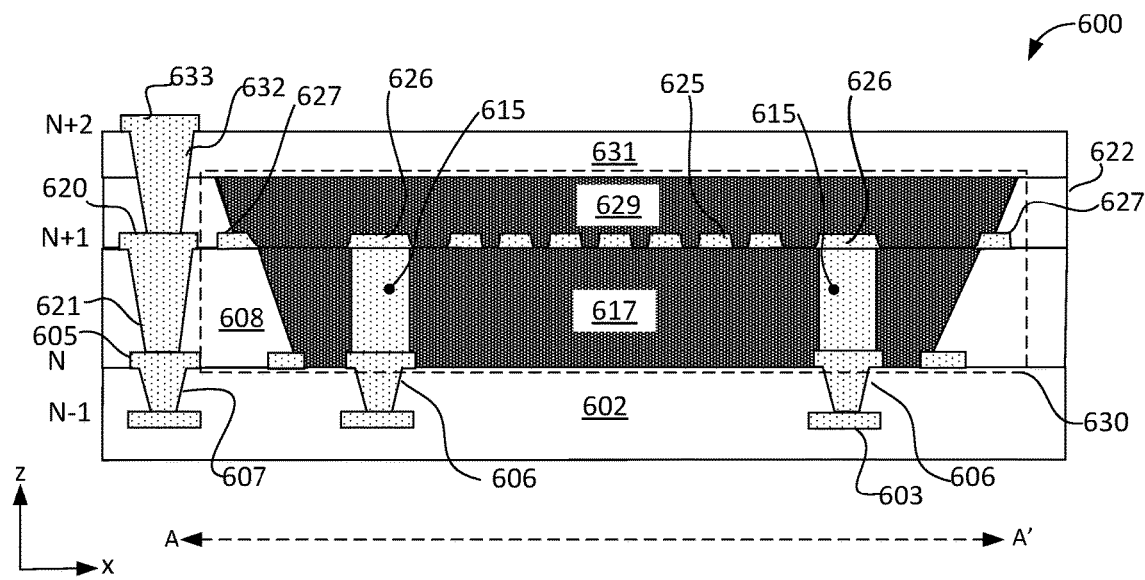
Figure 6R:
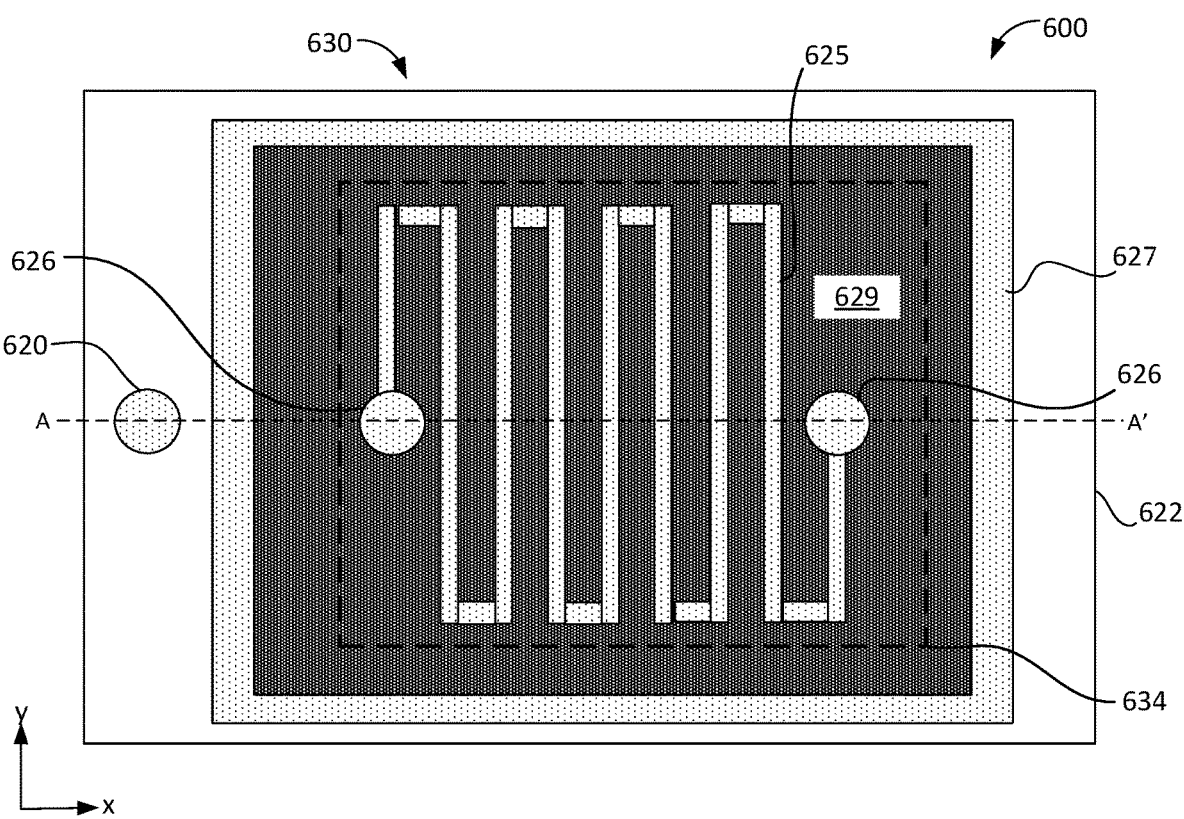

FIGS. 6A-6R illustrate cross-sectional views of representative structures formed at different stages of an exemplary process flow for forming package substrate 600 comprising a package-embedded inductor, according to some other embodiments of methods 100.

In FIG. 6A, package substrate stack 601 comprises dielectric 602 and embedded metallization structures 603 (level N−1). Preliminary metallization feature 604 and adjacent metal features (e.g., via pad 605) have been formed in level N over dielectric 602 in previous metallization operations, including semi-additive or subtractive metallization processes as described above. Vias 606 and 607 interconnect level N metallization structures, including preliminary metallization feature 604, to metallization structures 603 in level N−1.

In FIG. 6B, dielectric 608 is formed over dielectric 602, covering preliminary metallization feature 604 and adjacent metallization (e.g., pad 605). Aperture 609 is formed in dielectric 608, as shown in FIG. 6C, by a laser drilling or etching operation as described previously. Aperture 609 is formed to a depth $h_7$, for example ranging between 5 and 100 microns and exposing a portion of preliminary metallization feature 604. In the illustrated embodiment, sidewalls 610 have a slope angle $\theta_4$ ranging between 45° and 85°, for example as a result of a laser drilling process.

In FIG. 6D, a conformalmetal layer 611 of seed metal is deposited over dielectric 608, sidewalls 610 and preliminary metallization feature 604. Metal layer 611 may be formed by sputter or electroless deposition of a suitable metal, such as copper to a thickness $h_9$ ranging between 5 and 50 microns over dielectric 608. Metal layer 611 is deposited over preliminary metallization feature 604, increasing the overall thickness of the structure to $h_{10}$, approximately the sum of $h_7$ and $h_9$.

In FIG. 6E, photoresist 612 is applied over package substrate stack 601. Photoresist 612 may be a DFR laminate, for example. Photoresist 612 may have a thickness $h_{11}$ (ranging between 15 and 150 microns) that is greater than depth $h_8$ of aperture 609. Photoresist 612 is patterned in a lithographic operation to form openings 613 in the operation depicted in FIG. 6F.

In FIG. 6G, pillars 615 are deposited into openings 613. Pillars 615 may be formed by electrolytic (or electroless) deposition of copper or other suitable metal into openings 613. Pillars 615 may overfill openings 613 and extend above photoresist 612, as shown. For example, photoresist 612 may have a thickness of 15 microns, and pillars 615 may be grown to a z-height of 20 microns, extending for example 5 microns above via 606. Seed metal layer 611 and preliminary metallization feature 604 are etched to expose underlying dielectric (e.g., dielectric 602 and 608). Ring structure 616 may remain from the previous etch.

In FIG. 6I, magnetic material 617 is deposited into aperture 609, embedding pillars 615. Magnetic material 617 may be any of the magnetic material pastes or inks described earlier in this disclosure (e.g. same as magnetic material 207). Magnetic material 617 may overfill aperture 609 and spread over dielectric 608, forming overhang 618.

In FIG. 6J, magnetic material 617 and pillars 615 are planarized with dielectric 608. In FIG. 6K, metallization level N+1 is formed over to package substrate stack 601 above dielectric 608 and magnetic material 617. Preliminary metallization feature 619 and adjacent metallization (e.g., via pad 620) may be formed as SAP metal structures, where structures have substantially vertical and straight sidewalls as shown, or by a subtractive etch process producing concave sidewalls. Via 621, interconnecting metallization level N with metallization level N+1, may have been formed in a previous electrodeposition process. Pillars 615 interconnect lower metallization (e.g., metallization structures 603) with preliminary metallization feature 619 (later to be patterned into inductor traces). Preliminary metallization feature 619 may have lateral dimensions at least the same as magnetic material 617 (e.g., up to 20 mm).

In FIG. 6L, dielectric 622 is formed (e.g., by lamination) over N+1 metallization, including preliminary metallization structure 619. Aperture 623 is formed in dielectric 622 (e.g., by laser drilling or etching as previously described) in FIG. 6M. Aperture 623 may have the same size (e.g., width, depth) or smaller than aperture 609 formed in the operation shown in FIG. 6C. In the process depicted in FIG. 6N, photoresist 624 is applied (e.g., laminated or spin-coated) conformally over package substrate stack 601, covering sidewalls 611 and preliminary metallization feature 619 in aperture 623. Photoresist 624 may provide a lithographically patterned etch mask to form inductor structures from preliminary metallization feature 619.

In FIG. 6O, a plurality of inductor traces 625 have been formed in level N+1 by a subtractive etch process (as described above) transferring the lithographic pattern formed in the previous operation to preliminary metallization feature 619. Inductor traces 625 may have concave sidewalls and a trapezoidal profile indicative of an isotropic etch process as described above. Pads 626 may be formed simultaneously over pillars 615 by the etch process to couple inductor traces 625 to pillars 615 for vertical interconnect routing. Ring structure 627 extends from the interior of aperture 623 through sidewalls 628 into dielectric 622.

In FIG. 6P, magnetic material 629 is deposited into aperture 623, encapsulating inductor traces 625. Magnetic material may have the same or similar composition and magnetic properties (e.g., a relative magnetic permeability of 5-10) as magnetic material 617, and may contact magnetic material 617 by extending between inductor traces 625. A contiguous magnetic inductor core may therefore fully encapsulate inductor traces 625 in magnetic material, forming inductor structure 630 (delineated by the dashed outline).

In FIG. 6Q, dielectric 631 has been formed over package substrate stack 601, fully embedding inductor structure 630) (in dashed outline) in package dielectric. Metallization N+2 has been formed over dielectric 631, completing package 600. Via 632 has been formed and extends from via pad 633 in top level (e.g., level N+2) to via pad 620 in level N+1. Via 632 may be part of power routing within package 500.

FIG. 6R illustrates a plan view in the x-y plane of metallization level N+1. Line A-A' across the plan view indicates the position of the cross-sectional plane illustrated in FIG. 6Q. As shown FIG. 6R, inductor traces 625 are arranged in a continuous serpentine configuration forming a single inductor trace 634 (in dashed outline). Pads 626 terminate inductor trace 634, and in some embodiments may be interconnected to higher level metallization by formation of vias over pads 626. Via pad 620 is interconnected to top-level metallization pad 633, as shown in FIG. 6Q. Ring structure 627 is shown to be electrically isolated from inductor trace 634.

Figure 7:
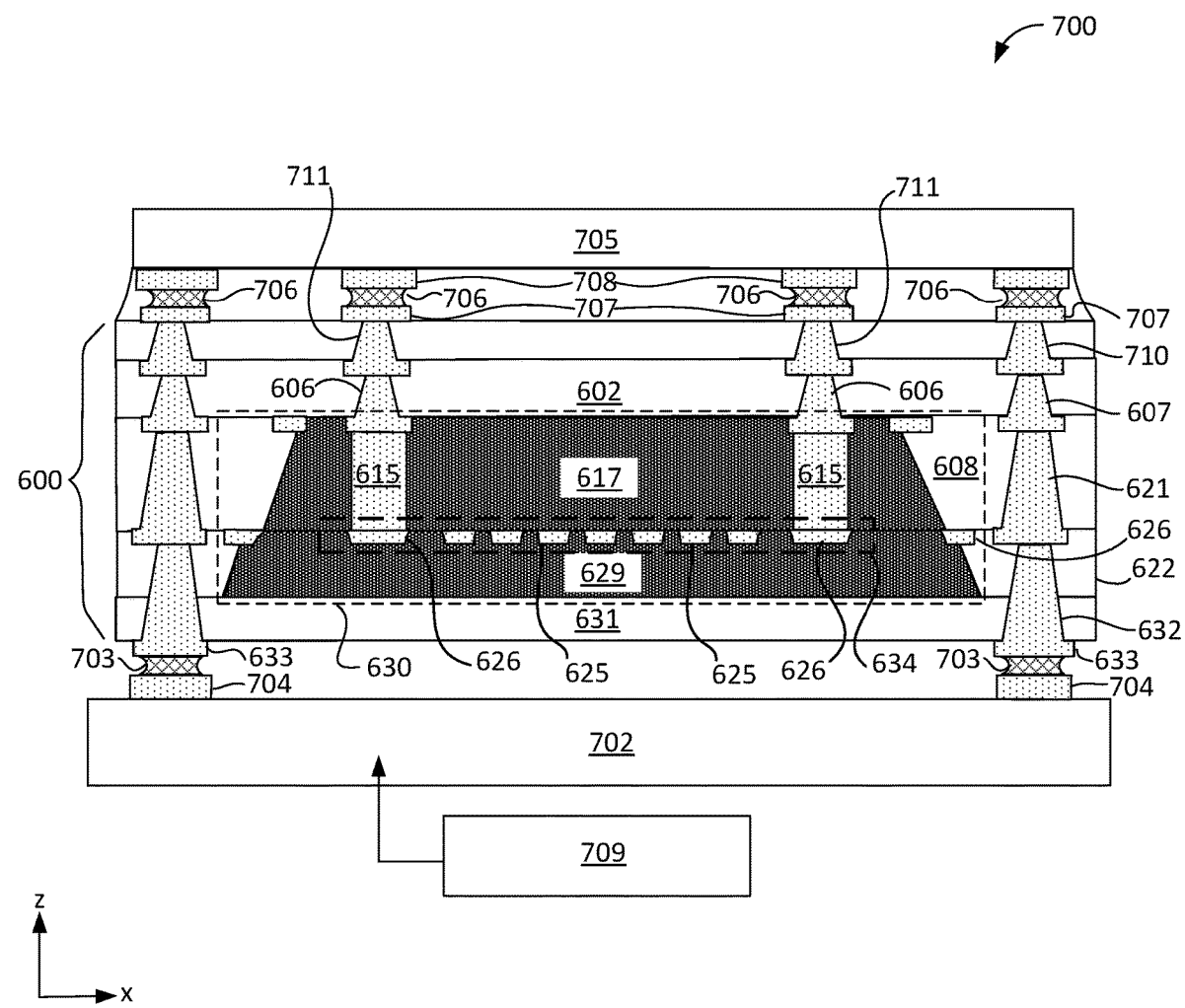
FIG. 7 illustrates a cross-sectional view in the x-z plane of an exemplary package assembly comprising a package substrate coupled to an IC chip and a host component, according to some embodiments of the disclosure.

FIG. 7 illustrates a cross-sectional view in the x-z plane of an exemplary component-mounted assembly 700 comprising package substrate 600 incorporated into IC package 701, according to some embodiments of the disclosure.

Top-level package metallization features 633 are interfaced to a host component 702 by second-level interconnects 703 (e.g., solder) to host component pads 704. An IC die 705 is interfaced to an opposite side of package substrate 600. First level interconnect 706 (e.g., solder) bond bottom level package metallization features 707 to interconnect pads 708 on IC die 705. In the illustrated example, power may be routed from a power supply 709 through PCB 702 to die 705 though inductor structure 628.

Inductor structure 630 may be employed as part of a fully integrated voltage regulator (FIVR) circuit, embedding the entire inductor structure 630 within the package substrate may enable a larger inductor and/or larger magnetic core than is possible to fabricate on the die. As a result, on-die buck conversion circuitry may operate at lower switching frequencies, relaxing power routing design rules on both die and package substrate. In other examples, inductor structure may be part of an rf oscillator tank circuit or an rf filter circuit.

Figure 8:
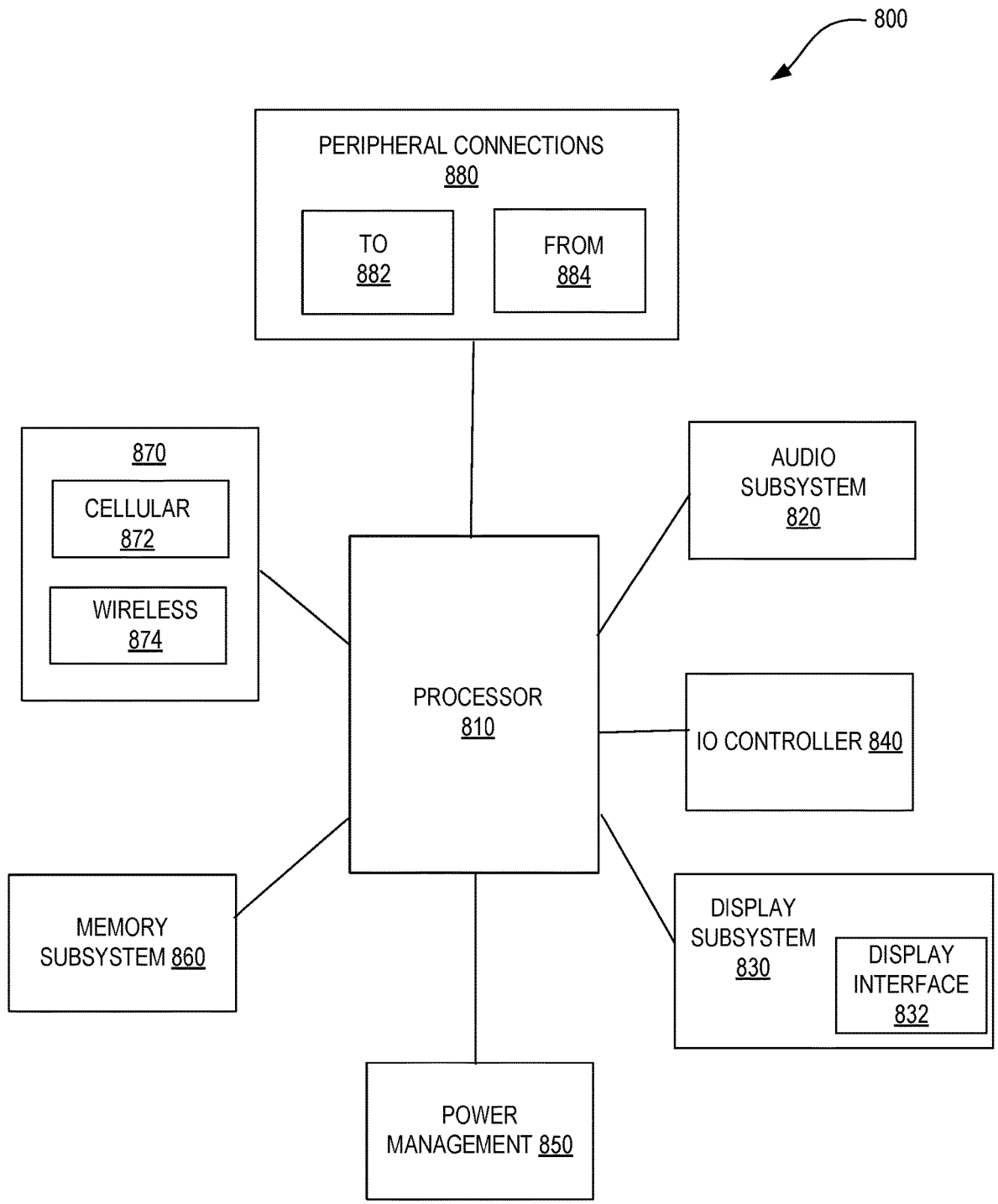
FIG. 8 illustrates a block diagram of a computing device incorporating some embodiments of the disclosure.

FIG. 8 illustrates a block diagram of computing device 800 as part of a system-on-chip (SoC) package in an implementation of a package-integrated inductor according to some embodiments of the disclosure.

According to some embodiments, computing device 800 represents a server, a desktop workstation, or a mobile workstation, such as, but not limited to, a laptop computer, a computing tablet, a mobile phone or smart-phone, a wireless-enabled e-reader, or other wireless mobile device.

In some embodiments, computing device 800 has wireless connectivity (e.g., Bluetooth, WiFi and 5G network). It will be understood that certain components are shown generally, and not all components of such a device are shown in computing device 800.

The various embodiments of the present disclosure may also comprise a network interface 870 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 810 represents a CPU or a GPU, and can include one or more physical devices, such as microprocessors, application processors, microcontrollers, programmable logic devices, or other processing means. Processor 810 may comprise any one of package substrates having an embedded inductor structure (e.g., any one of package substrates 200, 300, 400 500 or 600) as disclosed. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840) illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850) that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMS, EPROMS, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), Display Port including MiniDisplay Port (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) package substrate, comprising a magnetic material embedded within a dielectric material, wherein a first surface of the dielectric material is below the magnetic material, and a second surface of the dielectric material, opposite the first surface, is over the magnetic material, and a metallization level comprising a first metal feature embedded within the magnetic material, and a second metal feature at an interface of the magnetic material and the dielectric material, and a second metal feature at an interface of the magnetic material and the dielectric material, the second metal feature having a first sidewall in contact with the dielectric material and a second sidewall in contact with the magnetic material.

Example 2 includes all of the features of example 1, wherein the second metal feature completely surrounds the first metal feature, and extends along a perimeter of the magnetic material.

Example 3 includes all of the features of example 1 or example 2, wherein the metallization level comprises a multilayer material stack including a first metal on a second metal, the second metal having a higher permeability than the first metal.

Example 4 includes all of the features of any one of examples 1 through 3, wherein the metallization level further comprises a third metal feature embedded within a portion of the dielectric material laterally adjacent to a sidewall of the magnetic material wherein a sidewall of the third metal feature has less lateral undercut than the second metal feature.

Example 5 includes all of the features of example 4, wherein the second metal feature is one of a plurality of second metal features embedded within the magnetic material; the third metal feature is one of a plurality of third metal features embedded within the portion of the dielectric material; and the second metal features have a first pitch: the third metal features have a second pitch; and the second pitch is smaller than the first pitch.

Example 6 includes all of the features of examples 4 or 5, wherein the first sidewall has less lateral undercut than the second sidewall.

Example 7 includes all of the features of any one of examples 4 through 6, wherein the second metal feature has a greater thickness than the third metal feature.

Example 8 includes all of the features of any one of examples 1 through 7, wherein the sidewall of the magnetic material has a slope of at least 45° from the plane of the metallization layer.

Example 9 includes all of the features of any one of examples 1 through 8, wherein the metallization level is an upper metallization level, the substrate further comprises a lower metallization level, the lower metallization level comprises a lower metal feature between a bottom of the magnetic material and the first surface of the dielectric material, and the lower metal feature has larger lateral dimensions than a portion of magnetic material in contact with the lower metal feature.

Example 10 is an integrated circuit (IC) package assembly, comprising a power supply attached to a host circuit board, an IC die electrically coupled to the host circuit board through an inductor embedded within an IC package substrate, wherein the IC package substrate further comprises a magnetic material embedded within a dielectric material, wherein a first surface of the dielectric material is below the magnetic material, and a second surface of the dielectric material, opposite the first surface, is over the magnetic material, and a metallization level comprising an element of the inductor embedded within the magnetic material, and a metal feature at an interface of the magnetic material and the dielectric material, the metal feature having a first sidewall in contact with the dielectric material and a second sidewall in contact with the magnetic material.

Example 11 includes all of the features of example 10, wherein the inductor has a planar architecture comprising a serpentine structure embedded within the magnetic material.

Example 12 includes all of the features of examples 10 or 11, wherein the metal feature completely surrounds the element of the inductor, and extends along a perimeter of the magnetic material.

Example 13 includes all of the features of any one of examples 10 through 12, wherein the metallization level comprises a multilayer stack including a first metal on a second metal, the second metal having a higher permeability than the first metal.

Example 14 is a method of fabricating an integrated circuit (IC) package substrate, the method comprising forming one or more metallization layers embedded within a dielectric material, at least one of the metallization layers having been patterned into a preliminary metal feature, forming an opening through the dielectric material, the opening exposing a portion of preliminary metal feature, applying a dry film resist over the portion of the preliminary metal feature, patterning the preliminary metal feature into a first metal feature based on a pattern in the dry film resist depositing a magnetic material into the opening and over the first metal feature, and forming dielectric material over the magnetic material.

Example 15 includes all of the features of example 14, wherein forming an opening through the dielectric material comprises laser drilling an opening in the dielectric above the preliminary metal feature.

Example 16 includes all of the features of examples 14 or 15, wherein forming one or more metallization layers embedded within a dielectric material comprises forming the preliminary metal feature by a subtractive-additive process, and wherein one or more sidewalls of the preliminary metal feature has a slope of 10° or less from the plane of the preliminary metal feature.

Example 17 includes all of the features of any one of examples 14 through 16, wherein patterning the preliminary metal feature into a first metal feature comprises a subtractive removal of metal from the preliminary metal feature, and wherein one or more sidewalls of the first metal feature has a slope between 45° and 85° from the plane of the preliminary metal feature.

Example 18 includes all of the features of any one of examples 14 through 17, wherein the first metal feature comprises a serpentine trace comprising a plurality of parallel traces and a ring structure surrounding the serpentine trace, wherein the serpentine trace and a sidewall of the ring structure adjacent to the serpentine trace are formed by subtractive removal of metal of preliminary metal feature in a wet metal etch bath according to the pattern in the dry resist film.

Example 19 includes all of the features of any one of examples 14 through 18, wherein sidewalls of the plurality of parallel traces of the serpentine trace and the sidewall of the ring structure adjacent to the serpentine trace have a slope between 45° and 85° from the plane of the preliminary metal feature.

Example 20 includes all of the features of any one of examples 14 through 19, wherein the preliminary metal feature is a first preliminary metal feature in a first conductive level coplanar with the bottom of the opening, and a second preliminary feature is in a second conductive level on the dielectric material and over the first conductive level, and wherein a plurality of second metal features are formed simultaneously with the first metal feature by a subtractive removal of metal from the second preliminary metal feature.

Example 21 includes all of the features of any one of examples 14 through 20, wherein the first metal feature comprises plurality of parallel traces, wherein ones of the plurality of parallel traces are separated by a minimum pitch, wherein the plurality of second metal features are separated by a second minimum pitch, and wherein the first minimum pitch is substantially the same as the second minimum pitch.

Example 22 includes all of the features of any one of examples 14 through 18, further comprising forming a plurality of second metal features over the dielectric material adjacent to the magnetic material by a subtractive-additive process, wherein the plurality of second metal features is formed by deposition of metal into openings patterned into a photoresist or into the dielectric material.

Example 23 includes all of the features of any one of examples 14 through 22, wherein the sidewalls of the plurality of parallel traces are separated by a first minimum pitch, and sidewalls of the plurality of second metal features are separated by a second minimum pitch, and wherein the first minimum pitch is greater than the second minimum pitch.

Example 24 includes all of the features of any one of examples 14 through 23, wherein depositing a magnetic material into the opening comprises laminating a magnetic foil over a first dielectric, forming a second dielectric over the magnetic foil; and forming the opening over in the second dielectric over the magnetic foil to expose a portion of the magnetic foil.

Example 25 includes all of the features of any one of examples 14 through 23, wherein a copper foil is over the magnetic foil and bonded to the magnetic foil, wherein the magnetic foil comprises a first magnetic material, wherein the copper foil and the magnetic foil are simultaneously patterned to form a serpentine comprising a plurality of parallel traces having a first layer comprising the first magnetic material and a second layer over the first layer comprising copper, and wherein a second magnetic material is deposited over the plurality of parallel traces, and wherein the copper in the second layer is encapsulated by the first magnetic material in the first layer and the second magnetic material over the copper.

An abstract is submitted with the understanding that it will not be used to limit the scope or meaning of the claims. The following claims are hereby incorporated into the detailed description, with each claim standing on its own as a separate embodiment.

What is claimed is:

1. An integrated circuit (IC) package substrate, comprising:
    a magnetic material embedded within one or more dielectric materials, wherein the one or more dielectric materials is between a bottom of the magnetic material and a bottom side of the IC package substrate, and the one or more dielectric materials is between a top of the magnetic material and a top side of the IC package substrate, opposite the bottom side of the IC package substrate; and
    a metallization level comprising a first metal feature embedded within the magnetic material, and a second metal feature at an interface of the magnetic material and the one or more dielectric materials, wherein:
        the second metal feature completely surrounds the first metal feature, and extends along a perimeter of the magnetic material; and
        the second metal feature has a first sidewall in contact with at least one of the one or more dielectric materials and a second sidewall, opposite the first sidewall, in contact with the magnetic material, wherein:
            a sidewall of the first metal feature has a non-vertical first slope between a top of the first metal feature proximal to the top side of the IC package substrate that has a smaller lateral linewidth and a bottom of the first metal feature proximal to the bottom side of the IC package substrate that has a larger lateral linewidth;
            the second sidewall has the non-vertical first slope; and
            the first sidewall is more vertical than the second sidewall, and more vertical than the sidewall of the first metal feature.

2. The IC package substrate of claim 1, wherein the metallization level comprises a multilayer material stack including a first metal on a second metal, the second metal having a higher magnetic permeability than the first metal.

3. The IC package substrate of claim 1, wherein the metallization level further comprises a third metal feature embedded within a portion of the one or more dielectric materials laterally adjacent to second metal feature, and wherein a sidewall of the third metal feature is more vertical than the non-vertical first slope.

4. The IC package substrate of claim 3, wherein:
    the first metal feature is one of a plurality of first metal features embedded within the magnetic material;
    the third metal feature is one of a plurality of third metal features embedded within the portion of the one or more dielectric materials; and
    the second metal features have a first pitch;
    the third metal features have a second pitch; and
    the second pitch is smaller than the first pitch.

5. The IC package substrate of claim 3, wherein the first metal feature has a greater thickness than the third metal feature.

6. The IC package substrate of claim 1, wherein:
    the top of the magnetic material has a larger span than the bottom of the magnetic material; and
    a sidewall of the magnetic material has a slope of between 45° and 85° from a plane of the metallization level.

7. The IC package substrate of claim 6, wherein:
    the metallization level is an upper metallization level;
    the substrate further comprises a lower metallization level;
    the lower metallization level comprises a lower metal feature between a bottom of the magnetic material and at least one of the one or more dielectric materials; and
    the lower metal feature has larger lateral dimensions than a portion of the magnetic material in contact with the lower metal feature.

8. An integrated circuit (IC) package assembly, comprising:
    a power supply attached to a host circuit board;
    an IC die electrically coupled to the host circuit board through an inductor embedded within the IC package substrate of claim 1, the inductor comprising the first metal feature.

9. The IC package assembly of claim 8, wherein the inductor has a planar architecture comprising a serpentine structure embedded within the magnetic material, the serpentine structure comprising the first metal feature.

10. The IC package assembly of claim 9, wherein the second metal feature completely surrounds the serpentine structure, and extends along a perimeter of the magnetic material.

11. The IC package assembly of claim 10, wherein the metallization level comprises a multilayer material stack including a first metal on a second metal, the second metal having a higher magnetic permeability than the first metal.

12. The IC package substrate of claim 1, wherein the sidewall of the first metal feature has a curved profile.

13. The IC package substrate of claim 1, wherein the second sidewall has the slope of less than 10° from the vertical.

14. The IC package substrate of claim 1, wherein the second sidewall has the slope of less than 10° from the vertical.

15. The IC package substrate of claim 6, wherein the sidewall of the magnetic material with the slope between 45° and 85° is in contact with at least one of the one or more dielectric materials that is between the second metal feature and the bottom side of the IC package substrate.

16. The IC package substrate of claim 15, wherein at least one of the one or more dielectric materials that is between the second metal feature and the top side of the IC package substrate is in contact with a second sidewall of the magnetic material that also has the slope of between 45° and 85°.

17. An integrated circuit (IC) package substrate, comprising:
   a magnetic material within one or more dielectric materials that are both between a bottom of the magnetic material and a bottom side of the IC package substrate, and between a top of the magnetic material and a top side of the IC package substrate, opposite the bottom side of the IC package substrate; and
   a first metal feature embedded within the magnetic material, wherein a sidewall of the first metal feature has a non-vertical first slope between a top of the first metal feature, proximal to the top side of the IC package substrate, that has a smaller lateral linewidth and a bottom of the first metal feature that has a larger lateral linewidth; and
   a second metal feature coplanar with the first metal feature and at an interface of the magnetic material and the one or more dielectric materials, wherein:
      the second metal feature completely encircles the first metal feature, and extends along a perimeter of the magnetic material;
      the second metal feature has a first sidewall in contact with the magnetic material, and the first sidewall has the non-vertical first slope; and
      the second metal feature has a second sidewall, opposite the first sidewall, and in contact with the one or more dielectric materials, and the second sidewall is more vertical than the first sidewall, and more vertical than the sidewall of the first metal feature.

18. The IC package substrate of claim 17, wherein:
   the top of the magnetic material has a larger span than the bottom of the magnetic material; and
   a sidewall of the magnetic material has a slope of between 45° and 85° from a plane of the first and second metal features.

19. The IC package substrate of claim 18, wherein the first sidewall has the slope of less than 10° from the vertical.

* * * * *